(12) United States Patent
Devine et al.

(10) Patent No.: US 9,184,072 B2
(45) Date of Patent: Nov. 10, 2015

(54) ADVANCED MULTI-WORKPIECE PROCESSING CHAMBER

(75) Inventors: Daniel J. Devine, Los Gatos, CA (US);
Charles Crapuchettes, Santa Clara, CA (US); Dixit Desai, Pleasanton, CA (US);
Rene George, San Jose, CA (US);
Vincent C. Lee, Fremont, CA (US);
Yuya Matsuda, Saratoga, CA (US);
Jonathan Mohn, Saratoga, CA (US);
Ryan M. Pakulski, Discovery Bay, CA (US); Stephen E. Savas, Fremont, CA (US); Martin Zucker, Orinda, CA (US)

(73) Assignee: Mattson Technology, Inc., Fremont, CA (US)

( * ) Notice: Subject to any disclaimer, the term of this patent is extended or adjusted under 35 U.S.C. 154(b) by 2451 days.

(21) Appl. No.: 11/829,258

(22) Filed: Jul. 27, 2007

(65) Prior Publication Data

US 2009/0028761 A1 Jan. 29, 2009

(51) Int. Cl.
*B01J 19/08* (2006.01)
*B23P 17/04* (2006.01)
*H01L 21/67* (2006.01)

(52) U.S. Cl.
CPC ...... *H01L 21/6719* (2013.01); *H01L 21/67069* (2013.01); *Y10T 29/49* (2015.01)

(58) Field of Classification Search
CPC .............. H01L 21/6719; H01L 21/67069
USPC ........................................................ 118/719
See application file for complete search history.

(56) References Cited

U.S. PATENT DOCUMENTS

| 5,210,466 | A | 5/1993 | Collins et al. |
| 5,641,375 | A * | 6/1997 | Nitescu et al. ............. 156/345.1 |
| 5,855,681 | A | 1/1999 | Maydan et al. |
| 5,900,103 | A | 5/1999 | Tomoyasu et al. |
| 6,051,100 | A | 4/2000 | Walko, II |
| 6,178,919 | B1 | 1/2001 | Li et al. |
| 6,192,827 | B1 | 2/2001 | Welch et al. |
| 6,277,237 | B1 | 8/2001 | Schoepp et al. |
| 6,506,685 | B2 | 1/2003 | Li et al. |
| 6,583,064 | B2 | 6/2003 | Wicker et al. |
| 6,889,627 | B1 * | 5/2005 | Hao .......................... 118/723 R |
| 6,962,644 | B2 | 11/2005 | Paterson et al. |
| 2001/0000104 | A1 * | 4/2001 | Li et al. ............................. 216/67 |
| 2003/0176074 | A1 * | 9/2003 | Paterson et al. ................ 438/710 |
| 2004/0011467 | A1 * | 1/2004 | Hemker et al. ........... 156/345.49 |
| 2005/0247265 | A1 * | 11/2005 | Devine et al. .................. 118/719 |
| 2006/0037537 | A1 * | 2/2006 | Lombardi et al. ............. 118/719 |
| 2006/0039781 | A1 | 2/2006 | Niewmierzycki et al. |
| 2006/0045664 | A1 | 3/2006 | Niewmierzycki et al. |

* cited by examiner

*Primary Examiner* — Jeffrie R Lund
*Assistant Examiner* — Nathan K Ford
(74) *Attorney, Agent, or Firm* — Pritzkau Patent Group, LLC

(57) ABSTRACT

An apparatus and method are described for processing workpieces in a treatment process. A multi-wafer chamber defines a chamber interior including at least two processing stations within the chamber interior such that the processing stations share the chamber interior. Each processing station includes a plasma source and a workpiece pedestal for exposing one of the workpieces to the treatment process using a respective plasma source. The chamber includes an arrangement of one or more electrically conductive surfaces that are asymmetrically disposed about the workpiece at each processing station in a way which produces a given level of uniformity of the treatment process on a major surface of each workpiece. A shield arrangement provides an enhanced uniformity of exposure of the workpiece to the respective one of the plasma sources that is greater than the given level of uniformity that would be provided in an absence of the shield arrangement.

45 Claims, 27 Drawing Sheets

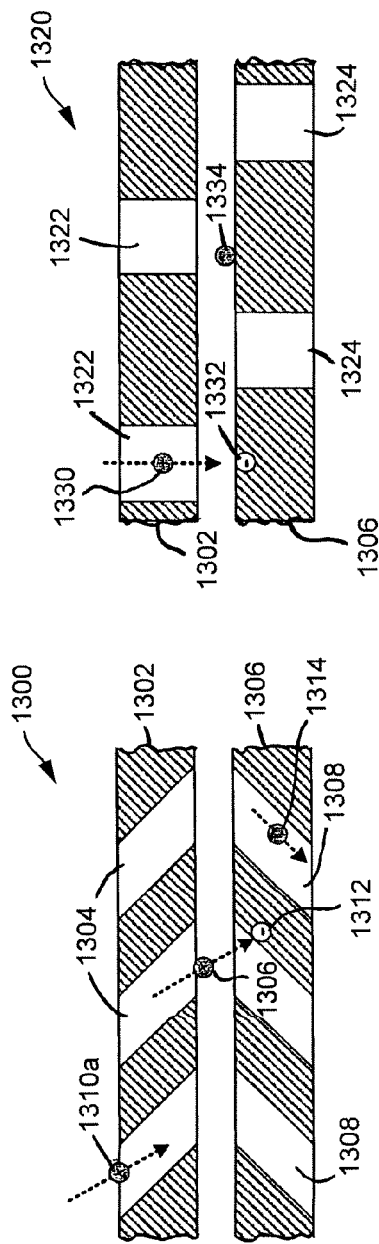
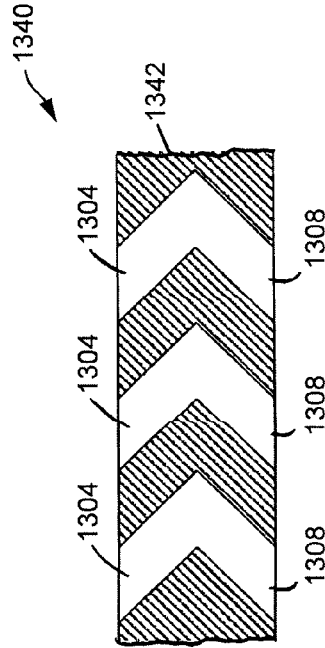
FIG. 29a
FIG. 29b
FIG. 29c

ADVANCED MULTI-WORKPIECE PROCESSING CHAMBER

BACKGROUND

The present invention is related generally to the field of workpiece processing such as, for example, processing semiconductor wafers and, more particularly, to a multi-workpiece processing chamber and its method of use.

A number of processing systems, currently used in the production of semiconductor wafers, are capable of processing more than one wafer at a time for purposes of enhancing system throughput. It has been asserted in the prior art, however, that a single-wafer process chamber provides more uniform process results when compared to multi-wafer processing chamber configurations. Presumably, this degradation in "across-wafer" and "station-to-station" uniformity is thought to be directly attributable to communication between adjacent wafer processing stations within a shared process chamber and environment.

Process uniformity, however, is of increasing concern, particularly in view of an industry emphasis on ever-decreasing device feature sizes. One example, attempting to provide a compromise between the asserted "cross-talk" contamination problem that is associated with batch processing in a shared process environment and limited throughput in the use of single-wafer process chamber, is seen in U.S. Pat. No. 5,855,681 (hereinafter the '681 patent). The latter adopts the use of "tandem" single wafer processing chambers, having processing regions that are described as being separate from one another (see col. 4, ln. 37-40). A single chamber body is used to define these separate processing regions using a shared chamber wall between the processing stations. The processing region defined by each tandem chamber is deemed by the patent as isolatable from the processing region of the other tandem chamber by virtue of limiting communication between the adjacent processing regions only to that which selectively occurs through an exhaust system. Such selective communication would presumably be controlled based on the pumping status of the vacuum pumping system. Otherwise, the tandem chambers appear to function, from a process standpoint, in a way which is essentially the same as a pair of separate single-wafer processing chambers (see, for example, col. 2, lns. 54-56). In this regard, the system provides for multiple, isolated processes to be performed concurrently in at least two regions (see col. 4, ln. 44-51), which reasonably suggests that a first process can be performed in one processing region of a tandem chamber while a second, different process is performed in the other processing region of that same tandem chamber.

While there may be advantages associated with the asserted capabilities of the separate, tandem chambers of the '681 patent in providing for simultaneously executing different processes in each chamber, it is recognized herein that there is a concern that, even if the same process is executed in both chambers, the chambers may provide different results as the conditions in each chamber are too independent and there is no feedback control that would keep these conditions equal. For example, this could occur if there is any tendency for contaminants to build up in exhaust channels 621, leading to different pressures in one chamber with respect to the other. In view of the foregoing and whereas the overall complexity of the '681 chamber design was intended to improve the crosstalk problem, resulting in a high cost of the chamber, it is believed that further improvement is needed.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Generally, an apparatus and associated method are described for processing workpieces in a treatment process. A multi-wafer chamber defines a chamber interior including at least two processing stations within the chamber interior such that the processing stations share the chamber interior. Each of the processing stations includes a plasma source or other suitable treatment source such as, for example, an electromagnetic energy source to perform a process and a workpiece pedestal for supporting one of the workpieces and each of the processing stations is configured for exposing one of the workpieces to the treatment process using its respective plasma source. The chamber isolates a treatment pressure in the chamber interior from an ambient pressure outside the chamber. The chamber includes an arrangement of one or more electrically conductive surfaces that are asymmetrically disposed about the workpiece at each processing station in a way which produces a given level of uniformity of the treatment process on a major surface of each workpiece. A shield arrangement is located in the chamber interior for each of the processing stations with each shield arrangement selectively operable (i) in a first, workpiece transfer mode to provide for transferring each workpiece to and from the workpiece pedestal of one of the processing stations and (ii) in a second, treatment mode to surround each workpiece, located on the workpiece pedestal of one of the processing stations, such that the treatment mode provides an enhanced uniformity of exposure of the workpiece to the respective one of the plasma sources that is greater than the given level of uniformity that would be provided in an absence of the shield arrangement. In one feature, the shield arrangement includes a first annular shield member surrounding the workpiece in a stationary position and a second shield member that is supported for movement between a first position and a second position in which first position the second shield member cooperates with the first shield member for operation of the shield arrangement in the wafer transfer mode, and in which second position, the second shield member cooperates with the first shield member for operation of the shield arrangement in the treatment mode.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be illustrative rather than limiting.

FIGS. 29a-c are diagrammatic fragmentary views, in elevation, illustrating a number of embodiments of high gas conductance structures that selectively block charged species while providing for transport of neutral species.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein. It is noted that the drawings are not to scale and are diagrammatic in nature. Further, like reference numbers are applied to like components, whenever practical, throughout the present disclosure. Descriptive terminology such as, for example, up/down, right/left, front/rear, uppermost/lowermost and the like has been adopted for purposes of enhancing the reader's understanding, with respect to the various views provided in the figures, and is in no way intended as been limiting.

Figure 1:
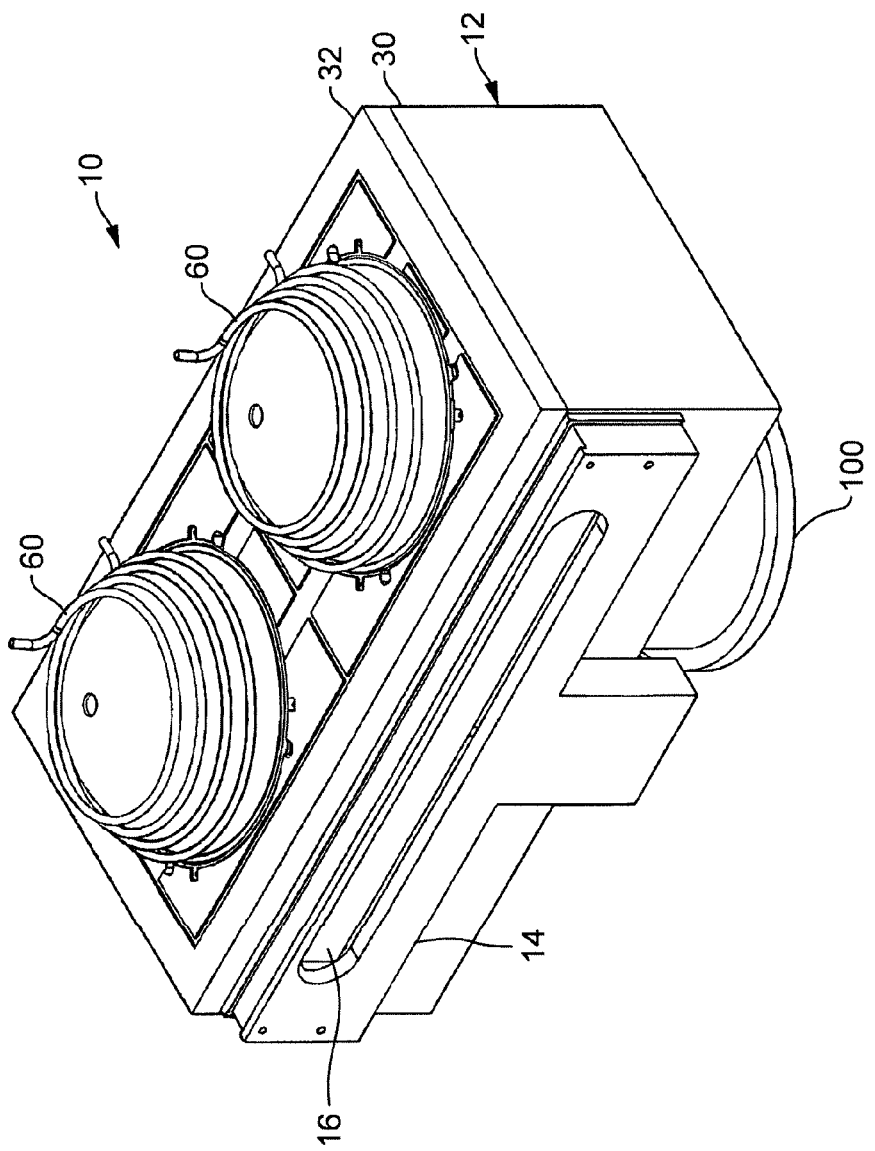
FIG. 1 is a diagrammatic view, in perspective, of one embodiment of a processing chamber arrangement that is produced according to the present disclosure.

Attention is directed to the figures wherein like reference numbers are used to indicate like components throughout the various figures when practical. FIG. 1 is a diagrammatic view, in perspective, of one embodiment of a processing chamber arrangement, generally indicated by the reference number 10. As will be seen, various other embodiments can be implemented while remaining with the teachings of the present disclosure. Further, it is to be understood that other embodiments may be apparent in view of the teachings herein and the present disclosure is not considered as being limited only to those embodiments that have been illustrated. Processing chamber arrangement 10 includes a processing chamber 12 and is illustrated with a slit valve arrangement 14 installed on the chamber showing a slit 16 door through which workpieces are transferred into and out of the chamber interior. It is noted that the slit valve arrangement is shown in a closed mode in the present example. While processing chamber 10 can be used as part of a wide variety processing systems, it is particularly useful with the workpiece transfer systems that are described in copending U.S. patent application Ser. No. 10/919,582 (hereinafter the '582 application), filed on Aug. 17, 2004, and copending U.S. patent application Ser. No. 11/097,412 (hereinafter the '412 application), filed on Apr. 1, 2005, both of which are incorporated by reference in their entirety and both of which are commonly owned with the present application. Specifically, processing chamber 12 accommodates the arrival and departure of workpieces along a radial arcuate path, although a linear or any other suitable path may be employed. Further, it is noted that chamber 12 provides a batch processing environment. That is, a plurality of processing stations share a common chamber interior environment, as will be further discussed.

Figure 2:
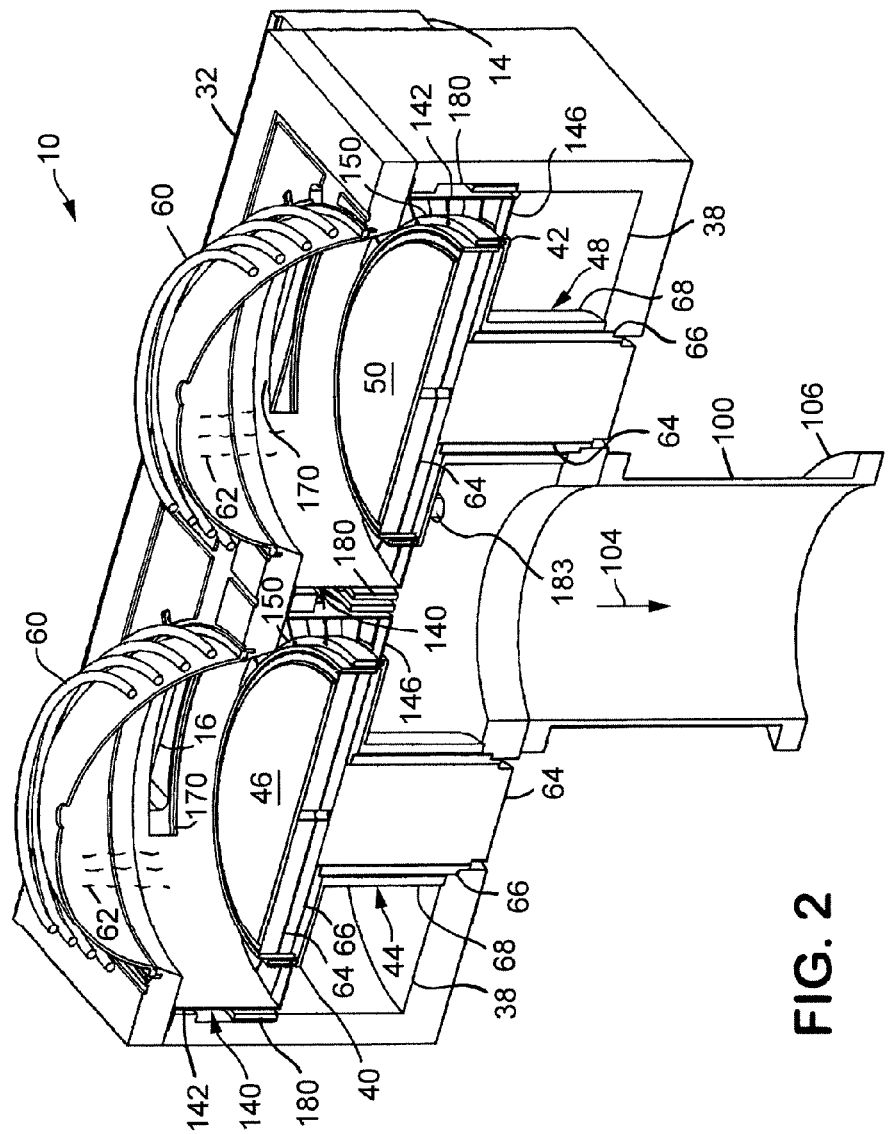
FIG. 2 is a partial cut-away, diagrammatic view, in perspective, of the processing chamber arrangement of FIG. 1, shown here to illustrate details with respect to its construction, including one embodiment of a shield arrangement that is used for each processing station of the processing chamber arrangement.

Referring to FIG. 2 in conjunction with FIG. 1, the former is a cut-away view, in perspective, showing a forward one-half of processing chamber 12 looking forward toward slit door 16. Processing chamber 12 includes a chamber body 30 and a chamber lid 32. The latter may be hingedly attached to the chamber body. The chamber lid and chamber body cooperate to define a chamber interior or cavity 38 (FIG. 2) that is isolatable from ambient pressure. A first processing station 40 and a second processing station 42 are positioned in chamber interior 38. First processing station 40 includes a pedestal assembly 44 for supporting a first workpiece 46 and second processing station 42 includes a second pedestal assembly 48 for supporting a second workpiece 50. It should be noted that chamber 12 provides an asymmetric arrangement of chamber sidewalls surrounding each processing station. That is, the chamber body includes an elongated length along which the processing stations are spaced apart such that some of the chamber sidewalls are nearer to a particular processing station than other ones of the chamber sidewalls. For purposes of the present example, processing chamber arrangement 10 could be described in the context of plasma etching a layer or pattern (not shown) such as a film of silicon nitride, or silicon dioxide from a semiconductor wafer, opto-electronic or flat panel display workpiece, although one of ordinary skill in the art will appreciate that this system is readily useful in the application of other processes including, but not limited to various implementations of plasma enhanced chemical vapor deposition (PECVD), plasma strip, and surface conditioning/preparation/cleaning as well as non-plasma mediated processes such as, for example, atomic layer deposition, rapid thermal processing (RTP), and surface engineering using a variety of electromagnetic and induction energy sources, for reasons to be brought to light at an appropriate point below. Accordingly, for purposes of the present example, a pair of plasma sources, each individual one of which is indicated by the reference number 60, is provided. For purposes of photoresist removal, inductively coupled plasma (ICP) sources, may be used such that one source is associated with each of the processing stations so as to generate a plasma 62 which is represented by a number of dashed lines. Other suitable plasma sources include, but are not limited to microwave sources, surface wave plasma sources, ECR plasma sources, and capacitively coupled (parallel plate) plasma (CCP) sources.

Continuing with a description of FIG. 2, each workpiece such as, for example, a semiconductor wafer having a circular periphery is supported on a susceptor 64. Each susceptor may be useful in heating the workpiece to a desired temperature. Any suitable type of susceptor may be used such as, for example, a suitable platen. Lift pins (not shown) can be used to raise and lower each workpiece with respect to each of susceptors 64. Radio frequency (RF) power may be supplied to the susceptors in a known manner. In this case, each pedestal further includes an insulator 66 and a ground shield 68 that is outwardly positioned with respect to the insulator. It is not a requirement to use an RF powered susceptor. If RF power is required, the pedestal directly supporting the workpiece may be grounded. Further, in such a case insulator 66 and separate ground shield 68 may not be required. Another part of the chamber configuration includes an exhaust arrangement 100 that is used in controlling the gas pressure, in cooperation with gas that flows into chamber interior 38. For this purpose, exhaust gas 104 flows in a direction indicated by an arrow. Exhaust arrangement 100 includes, for example, a flanged pump spool 106, which serves in the manner of a tailpiece, and which is attached to chamber body 30 in any suitable manner such as, for example, using a plurality of bolts (not shown). Sealing may be performed, for example, using an O-ring or metal gasket (not shown) between the flanged spool and chamber bowl.

Figure 3:
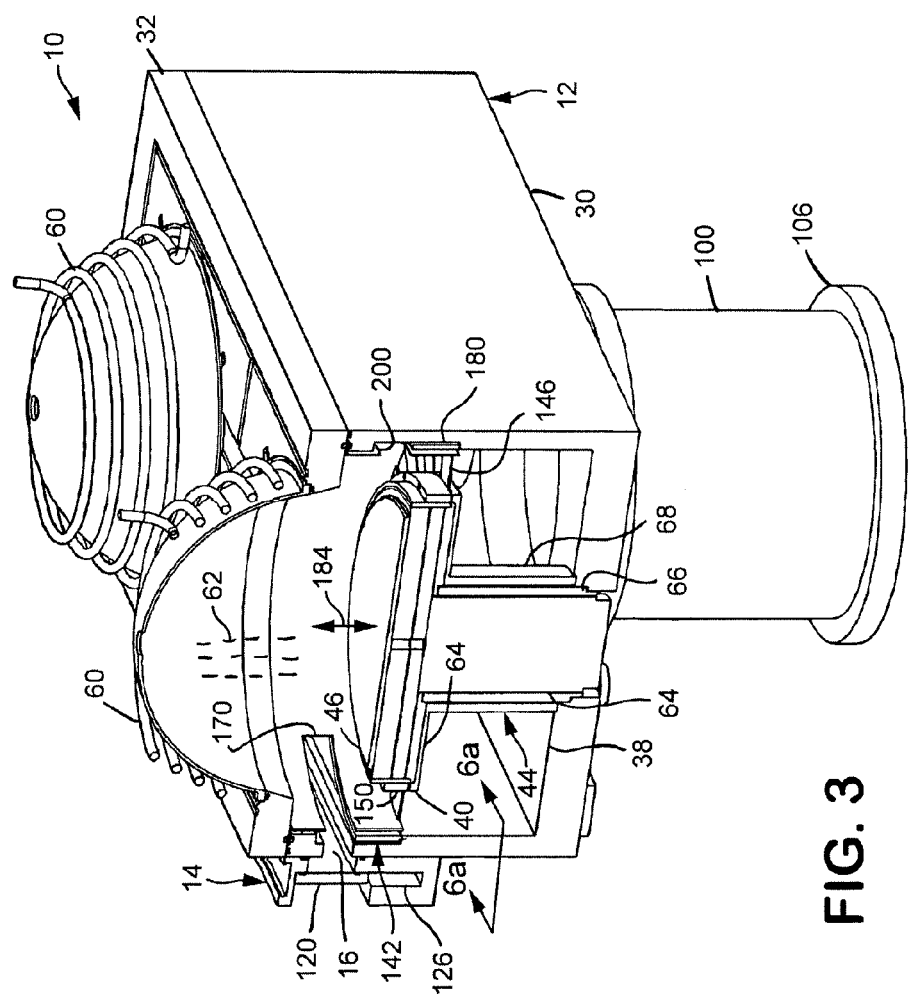
FIG. 3 is another partial cut-away, diagrammatic view, in perspective, of the processing chamber arrangement of FIG. 1, shown here to illustrate additional details with respect to its construction including the embodiment of the shield arrangement of FIG. 2.
Figure 4:
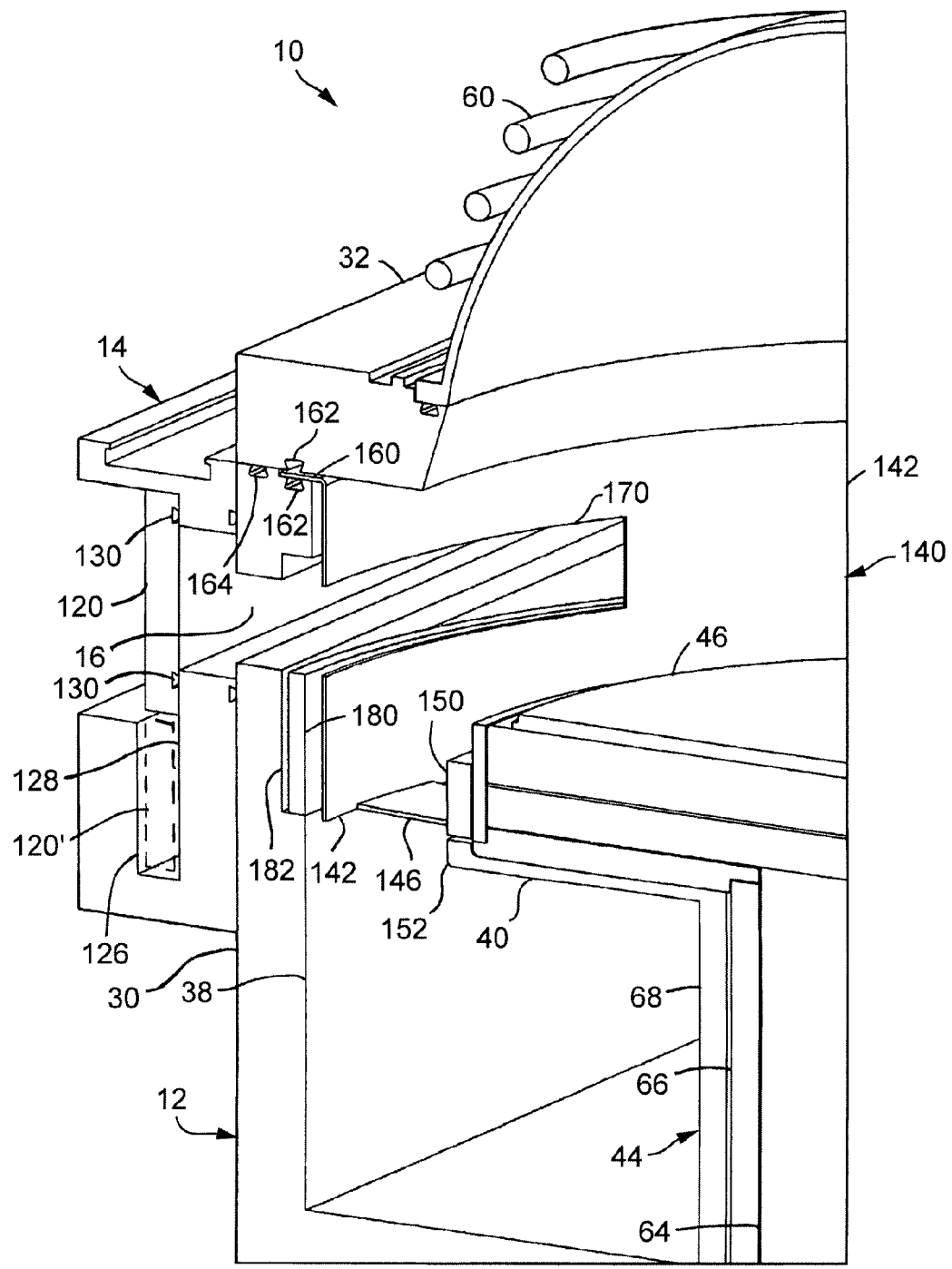
FIG. 4 is yet another partial cut-away, diagrammatic view, in perspective, of the processing chamber arrangement of FIG. 1, shown here to particularly illustrate details with respect to the embodiment of the shield arrangement of FIG. 2, located at one of the processing stations in the processing chamber arrangement.

Referring now to FIGS. 3 and 4, attention is directed to further details with respect to processing chamber 10. FIG. 3 is a partially cut away view, in perspective, of chamber arrangement 10 having the cut taken through processing station 40 to remove one end of elongated chamber body 30 and to remove a corresponding end of chamber lid 32. FIG. 4 is another partially cut away view, in perspective, that is further enlarged with respect to the view of FIG. 3 to show additional details with respect to the side of the chamber that supports slit valve 14. In particular, slit valve 16 includes a gate 120 that is configured for selectively sealing slit 16. When the slit valve is open, gate 120 moves outward from its illustrated position and down, as shown in phantom, indicated by the reference number 120' into a slot 126 in FIG. 4. In the closed position, as best seen in FIG. 4, sealing of gate 120 against a surface 128, which peripherally surrounds slit 16, can be accomplished using an o-ring (not shown) that is supported by gate 120 in an appropriate groove 130.

Figure 5:
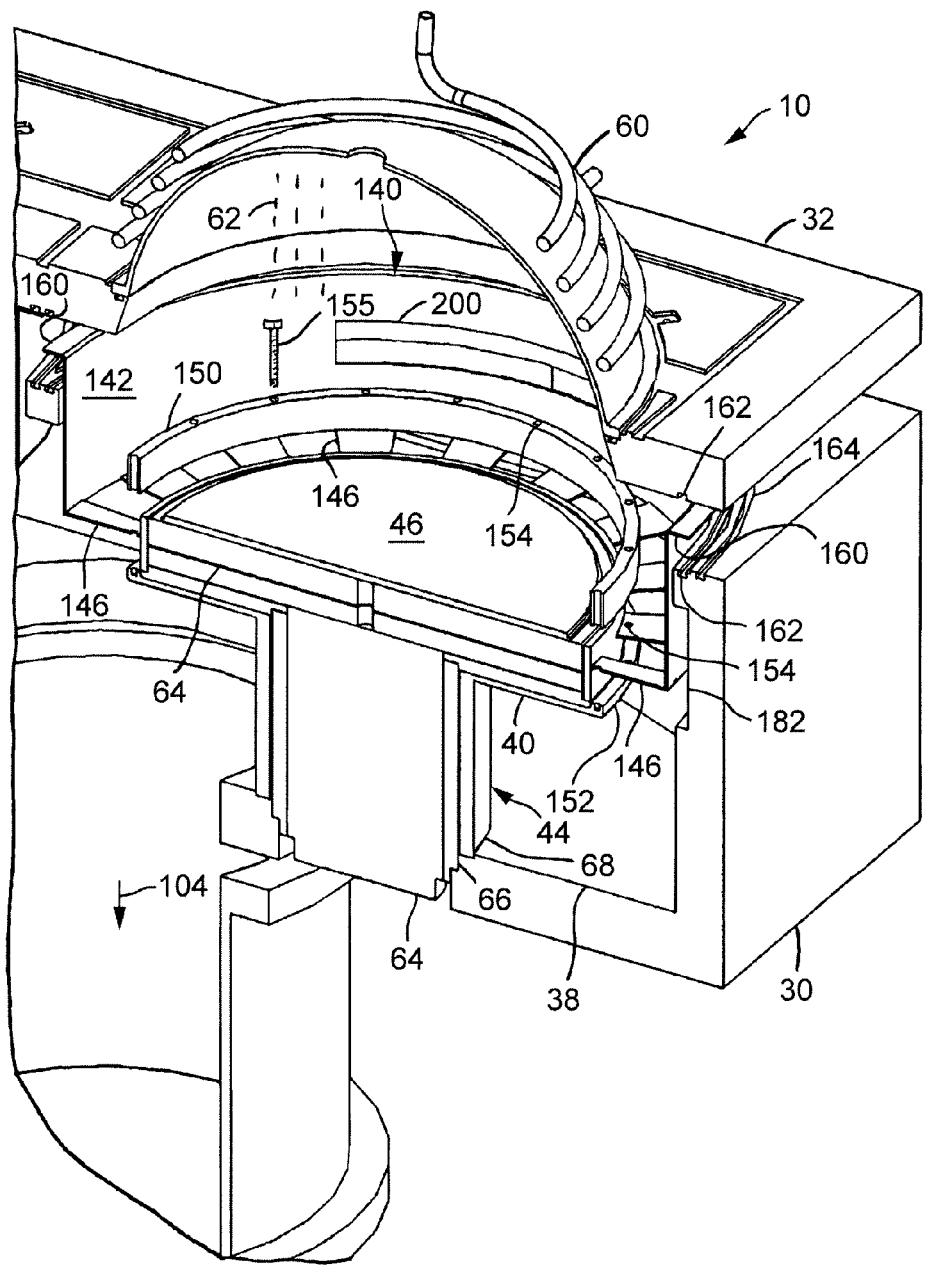
FIG. 5 is a partial cut-away, exploded diagrammatic view, in perspective, of the processing chamber arrangement of FIG. 1, shown here to illustrate further details with respect to the embodiment of the shield arrangement of FIG. 2, located at one of the processing stations and its installation in the processing chamber arrangement.

Referring to FIGS. 2-5, one embodiment of a shield arrangement 140 illustrated as used for each of processing stations 40 and 42. FIG. 5 is a partially exploded and cut-away, perspective view of processing chamber 10, illustrating chamber body 30 and chamber lid 32 in a spaced apart relationship with respect to one another, as well as exhaust arrangement 100 spaced away from chamber body 30. Other components, yet to be described, are also illustrated in a spaced apart relationship. Shield arrangement 140 is associated with each processing station. Each shield arrangement 140 can include a first shield member 142 that can be generally cylindrical in configuration having an upper opening that faces one of plasma sources 60. The first shield member includes a peripheral outline that surrounds a respective one of the processing stations. A lower end of first shield member 142 supports a plurality of inwardly projecting web members 146. Suitable materials for use in producing the shield arrangements described throughout this disclosure include, but are not limited to aluminum or other metal so long as the material chosen is suitably overcoated to be non-reactive to the process ambient. The shield components may be treated, for example, with plasma resistant coatings such as anodized coatings and non-reactive ceramic coatings such as yittria-aluminum-oxide (YAG) and/or yittria. As seen in FIG. 5, each web member includes a free end. A clamping ring 150 can be used to capture the free end of each web member against a peripheral step 152 of a respective one of ground shields 68. The clamping ring may engage peripheral step 152 of the ground shield in any suitable manner for clamping purposes. In the present example, the peripheral step and clamping ring define apertures 154 that can receive suitable fasteners 155 such as threaded fasteners, one of which is shown in FIG. 5. Since each ground shield 68 is grounded, web members 146 are grounded and serve in grounding first shield member 142. However, first shield member 142 is selectively disengagable with the processing chamber.

Still referring to FIGS. 2-5, the upper end of each first shield member defines a peripheral, outwardly projecting flange 160 that can be captured between chamber body 30 and chamber lid 32 when the latter is in its closed position. As best seen in FIGS. 4 and 5, each of the chamber lid and the chamber body define a groove 162 that surrounds the opening defined in chamber lid 32 for each source and can receive a suitable radio frequency shielding material such as, for example, a flexible crushable or braided material that may be formed, by way of example, from nickel plated brass. It should be appreciated, however, that vacuum sealing between the chamber lid and chamber body is separately accomplished using an O-ring that is disposed within a peripheral groove 164 that is defined by the chamber body surrounding both processing stations. Thus, gaseous species can flow around a circuitous or non-line-of-sight path that is cooperatively defined by the chamber body, the chamber lid and flange 160 of the first shield member, since the radio frequency shielding material that is disposed within grooves 162 is not intended to provide pressure sealing, while effectively serving to ground first shield member 142. The latter further defines a workpiece transfer slot 170 (FIGS. 2-4) through which workpiece 46 can be moved to and from processing station 46. In this regard, workpiece transfer slot 170 is at least generally vertically aligned with slit 16 of the chamber body. In addition to flange 160 providing for electrical communication with the chamber lid and body, it should be appreciated that this flange also provides for thermal communication so as to help maintain the temperature of first shield member 142.

Temperature considerations, with respect to process results, will be discussed at an appropriate point below. It is noted that by grounding shield member 142 both at the top of the chamber, via the chamber lid, and through pedestal ground shield 68 (FIG. 2), to the bottom of the chamber, the shield member is provided with an overall grounding scheme, as current can flow more freely both upward and downward to the chamber lid and body.

With continuing reference to FIGS. 2-5, a second shield member 180, forming part of each shield arrangement, is supported for movement vertically in the view of the figures within a recess 182 that is defined by chamber body 30. It should be appreciated that recess 182 is only needed in regions where the second shield member is sufficiently close to a chamber wall. In this regard, the chamber walls diverge from the second shield member as the chamber walls lead to the corners of the chamber. Once a sufficient clearance is present between the chamber walls and the second shield member, recess 182 is not needed. The second shield member can be moved, for example, by an actuator shaft 183 (FIG. 2) that is positioned between the processing stations and appropriately connected to the second shield member of each processing station. It should be appreciated that actuator shaft 183 can serve in grounding second shield members 180. Further, each second shield member 180, like each first shield member 142, can be selectively removed from the processing chamber. In this regard, an actuator arm may include any suitable configuration such as, for example, a press fit or threaded engagement wherein the actuator arm and second shield member(s) 180 are removed from chamber 30 and re-installed as a unit. Other configurations are also possible such as, for example, snap rings, set screws, and the like. As seen in FIG. 3, first shield member 142 defines an axis of symmetry 184 along which second shield member 180 can be moved from a workpiece transfer position, as illustrated, to a treatment position that will be described in further detail below. The second shield member is generally positioned in a non-contacting or spaced apart relationship with respect to the first shield member and any other components in order to avoid rubbing contact that can generate particles. Further, as will be seen, second shield member 180 can have an annular configuration.

Referring to FIGS. 3 and 5, in one embodiment, first shield member 142 defines an additional slot 200 that at least approximately symmetrically opposes workpiece transfer slot 170. In this way, any radial nonuniformity that is introduced by the presence of workpiece transfer slot 170 is azimuthally matched by the presence of additional slot 200. Moreover, as a result of the annular configuration of second shield member 180, additional slot 200 is addressed by the second shield member in essentially the same manner that the second shield member addresses workpiece transfer slot 170 in the treatment position, thereby further enhancing radial uniformity in directions that extend between workpiece transfer slot 170 and additional slot 200. That is, from the perspective of the plasma, slot 200 as affected by second shield member 180 can be a mirror image of slot 170 as affected by second shield member 180. As will be further described, in some embodiments, second shield member 180 is not required to be annular in configuration, but may be in the form of a shutter which confronts workpiece transfer slot 170 so as to limit opportunities for ion passage from the interior of the shield arrangement. When opposing slots are used, as in FIG. 5, a separate shutter may be used in relation to each of the slots. These separate shutters can be moved in unison, by a shared actuator and appropriate mechanical linkages, or moved individually by independent actuators. When an annular configuration is used for the second shield member, portions of shield material may be removed that do not provide a significant contribution to containing ions within the shield arrangement in the treatment position. In one embodiment, a fixed shield member (not shown) may be used to mimic a movable shutter in a confronting relationship with additional slot 200, since there is no need to perform workpiece transfers through slot 200 in the present embodiment. That is, such a fixed shield member may be attached to the first shield member or suitably supported to approximate the presence of a movable shutter, for example, by maintaining essentially the same relationship between the fixed shield member and the first shield member at slot 200 as is present between a movable shutter, in the treatment position, and workpiece transfer slot 170. It should be appreciated that a range of opportunities is available with respect to limiting ion transport through additional slot 200, in view of the foregoing description.

It is recognized that a number of process related constituents are associated with plasma 62. These process related constituents generally include neutral species, by way of example, $CF_4$, $CH_2F_2$, $CHF_3$, $CH_3F$, $CL_2$, Ar, $CO_2$, $O_2$, $H_2$, and ionized species, by way of example, $C_3F_5^+$, $C_2F_4^+$, $CF_3^+$, $CF^+$, $F^-$, $Ar^+$, $H^+$, $O^-$, $O^+$. It is further recognized that these two different types of species travel in different ways within chamber interior 38. Specifically, neutral species are capable of traveling along a line-of-sight path and a non-line-of-sight, circuitous path while charged species generally react with chamber surfaces and are generally capable of only line-of-sight travel in an absence of any external influence. In the presence of grounded or charged surfaces, charged ions may travel along a curved path. For example, in the instance of a positive ion and a grounded surface, the positive ion will have a high probability of curving toward and impacting against a charged surface, as will be discussed in further detail immediately hereinafter.

Figure 6A:
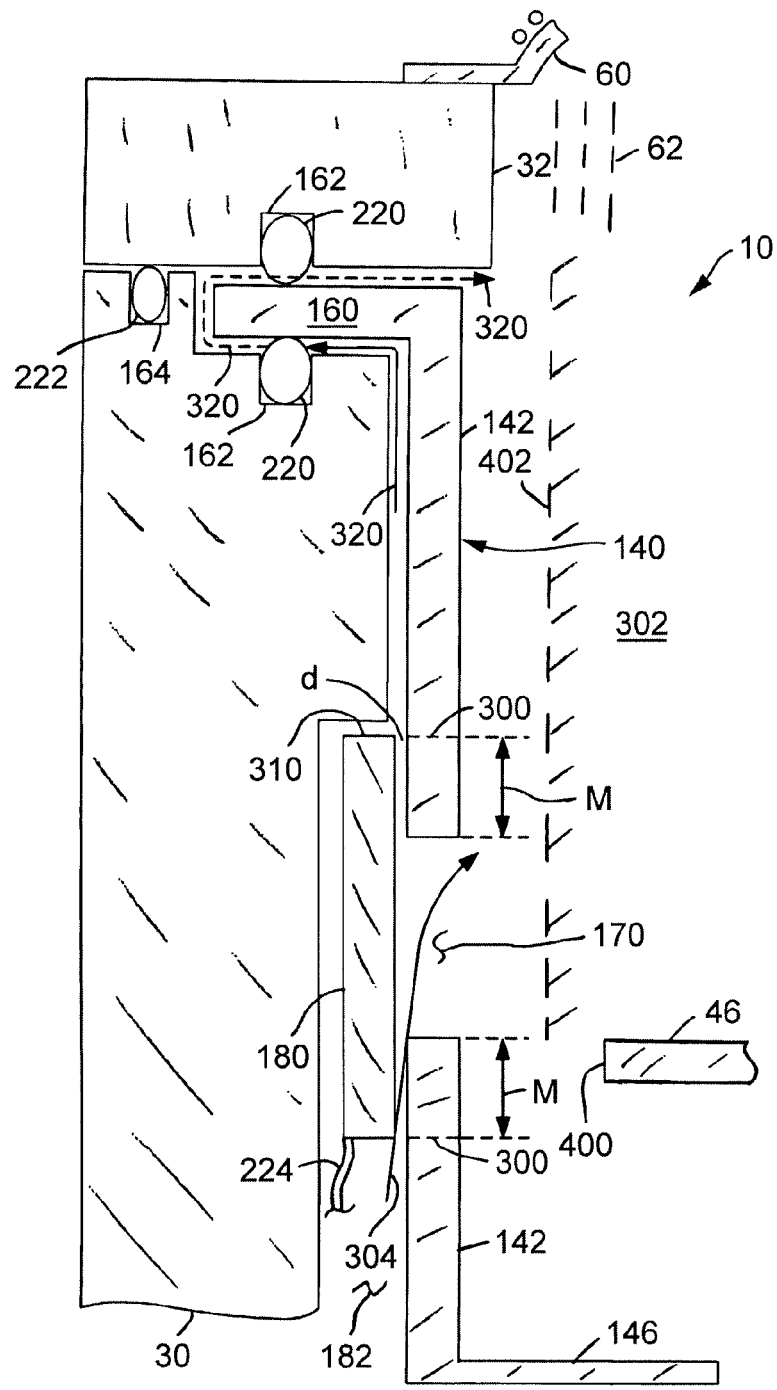
FIG. 6a is a partial cut-away diagrammatic view, in elevation, taken from a line 6a-6a in FIG. 3, shown here to illustrate details of this embodiment of the shield arrangement proximate to a workpiece transfer slot.

Referring to FIG. 6a, a diagrammatic illustration is provided, as a view that is taken from a line 6a-6a in FIG. 3, showing a cross-section of shield arrangement 140 including first shield member 142 and second shield member 180 with the latter in the treatment position, adjacent to workpiece transfer slot 170. Source 60 can be supported on and sealed to chamber lid 32 in any suitable manner. Appropriate portions of chamber body 30 and chamber lid 32 are also shown. It is noted that the slit valve arrangement has not been shown for purposes of illustrative clarity. A radio frequency shielding material 220, as discussed above, is disposed in each of grooves 162, while an O-ring 222 is disposed in groove 164 to seal the chamber to the lid. Shielding material 220 can serve in grounding first shield member 142 to both the chamber body and lid. One or more flexible straps 224 can be used to ground second shield member 180. It should be appreciated that second shield member 180 includes a peripheral outline that projects onto first shield member 142, illustrated by dashed lines 300, such that a margin M is formed around the periphery of slot 170, while second shield member 180 is spaced away from the exterior of first shield member 142 by a distance d. With respect to an ion attempting to travel into an interior 302 of shield arrangement 140 along a path 304, it is evident that the ion would necessarily have to travel along a curved path. In the instance of a positively charged ion, however, the ion would likely contact one of the grounded surfaces adjacent to path 304, for example, by being attracted to the various grounded surfaces and fail to reach the interior of the shield arrangement. In any case, an angle of entry along path 304, which is defined through the cooperation of the various components, does not provide for line-of-sight travel from exterior to the shield arrangement to the interior of the shield arrangement. By maintaining margin M along an upper edge 310 of the second shutter member, entry of ions is equally limited. In an embodiment where the second shield member is annular in configuration, surrounding the first shield member, an effective margin against ion transport is provided at the vertically extending edges of slot 170 that is greater than margin M. In the case of using a shutter member having opposing edges that define a width of the shutter member, rather than an annular configuration, margin M can likewise be maintained at the vertically disposed edges of the shutter member to limit ion transport. Effectively, the shutter member includes a peripheral outline that projects onto the exterior of the first shield member in a surface normal direction, so as to surround slot 170. Similarly, when an additional slot 200 is present, the spacing arrangements illustrated by FIG. 6a may be maintained in the manner described, whether an annular second shield member is used or a separate shutter is used.

Continuing to refer to FIG. 6a, the arrangement of peripheral flange 160 between chamber body 30 and chamber lid 32 is seen in further detail. In particular, a circuitous path is formed having an initial portion 320, illustrated by a solid line and leading to lowermost groove 162 and shielding material 220 therein. Circuitous path 320 continues along another portion, illustrated by a dashed line, around the edge of flange 160, through shielding material 220 disposed within uppermost groove 162 and then to the interior of shield 302. Accordingly, the probability of successful travel of an ion along the length of this circuitous path is considered to be remote, at best. Even though ion transport is essentially blocked by such a circuitous path, it should be appreciated that neutral gaseous species may travel along this path and that this path may serve as an expedient in maintaining pressure equalization between the interior of a particular shield arrangement and the overall chamber interior, as well as the interiors of any other shield arrangements. As discussed above, treatment pressure is maintained, versus the ambient surroundings of processing chamber 10, by O-ring 222. Suitable widths for a circuitous passage that are useful in the context of the present application include approximately 0.2 to 5 mm. Of course, a relatively wider gap produces a greater conductance such that gap size can be tailored to the needs of a particular process. In this regard, it should be appreciated that a greater value of conductance is generally useful to further enhance pressure equalization at lower processing pressures.

Referring to FIG. 2, it is considered that movement of neutral species from one processing station to another processing station has little, if any, impact upon process results. On the other hand, it is considered that movement of charged species (i.e., ions) from one processing station to the other processing station could have a detrimental influence upon process results. Therefore, it is desired to minimize charged species cross-contamination between the processing stations, while providing for free flow of neutral species between the processing stations. By providing for free flow of neutral species between processing stations, a high degree of pressure equalization is achieved. A high degree of pressure equalization is desired to achieve process control with both optimal and mirrored process results between adjacent processing regions. This limited or selective communication of process related products between processing regions is desirable, at least in part, so to maintain equal pressure in adjacent processing regions. To this end, communication path 320 around flange 160 and at slot 170, between the first and second shield members, increases isolation of gas reactive gaseous process related products and allows exchange of neutral gaseous process related products within the processing chamber and between the processing stations. Equal pressure in the adjacent processing region is desirable to assure that the process results achieved in one process region mirror those results obtained in the adjacent processing region when a single pressure control and gas delivery system (not shown), as is used here, is used to provide chamber pressure. Based on the desired level of cross communication between processing stations, the same process should be practiced at all of the processing stations or at least one processing station may be idle. Shield arrangement 140 also cooperates with the chamber to provide another benefit. In particular, light is limited insofar as travel between processing stations such that instrumentation that is responsive to such light is not affected in an adverse way. For example, process end point control is often established based on optical measurements. Light traveling from one process station to the other could then influence the process end point at the other processing station. Shield arrangement 140 operates in a way which is intended to effectuate these purposes.

Still considering the benefits that are provided by system 10 and, more particularly, shield arrangement 140, it is worthwhile to initially consider the manner in which chamber 30 influences plasma 62 in the absence of the shield arrangement. In this regard, processing chamber arrangement 10 utilizes a chamber interior that is shared by at least two processing stations with each processing station having a plasma source and a workpiece pedestal, and each of which processing stations is configured for exposing one of the workpieces to the treatment process using a respective plasma source. The processing chamber serves to isolate a treatment pressure in the chamber interior from an ambient pressure outside the chamber. The chamber, however, disposes an arrangement of one or more electrically conductive and grounded chamber surfaces asymmetrically or in a non-uniform manner about each processing station in a way which produces an undesirable effect, given level of uniformity of the treatment process on a major surface of each workpiece that confronts each plasma source. In particular, the plasma of each plasma source will interact with the asymmetrically distributed chamber surfaces so as to produce a plasma density adjacent to each workpiece that is inherently non-uniform. In other words, a plasma body, produced by each plasma source, is deformed to at least somewhat conform with the asymmetrically distributed chamber surfaces. Further, the plasma body of each source may also be affected by the adjacent plasma source or due to the presence of one or more adjacent processing stations. Shield arrangement 140, in the treatment mode, provides an arrangement of conductive, grounded surfaces around each processing station that is more symmetric than the arrangement of asymmetrically distributed chamber surfaces. In the treatment mode, the shield arrangement of each processing station serves to surround each workpiece to provide an enhanced uniformity of exposure of the workpiece to its associated plasma source that is greater than the given level of uniformity that would be provided without the shield arrangement. From a practical standpoint, shield arrangement 140, in the treatment mode, provides an arrangement of conductive, grounded surfaces distributed around each processing station in the treatment mode that is essentially symmetric or symmetric at least to an approximation. In this regard, it should be appreciated that a plasma is an electrically sensitive body that is influenced by return currents (i.e., ground paths). Further, shield arrangement 140 essentially eliminates the influence on the plasma that is caused by slit valve 14 (see, for example, FIG. 4) which itself represents an arrangement of asymmetrically distributed conductive surfaces, while still facilitating the use of the slit valve with shield arrangement 140 in its workpiece transfer mode.

With regard to the use of the slit valve in the workpiece transfer mode, the shield arrangement elegantly transforms itself to accommodate workpiece transfer by moving a portion of the shield arrangement out of the path along which the workpiece is to be moved. Since the movable second shield member can be lightweight, movement between the workpiece transfer and workpiece treatment positions can be accomplished quickly, with essentially no detrimental effects on system throughput. Further, it is recognized that it can be beneficial to move the second shield member vertically with access from the chamber bottom. In this way, a great deal of flexibility is provided with respect to the configuration of the shield arrangement, as is demonstrated by number of embodiments of the shield arrangement that are described below. Further, the actuation components can be located as remotely as possible from the process constituents.

Referring again to FIG. 6a, each workpiece can include a circular peripheral outline 400 and each shield arrangement, for each processing station in the treatment mode, can introduce a generally cylindrical plasma volume 402 at least between the workpiece, for example, workpiece 46, at that processing station and the plasma source of that processing station while maintaining a pressure equalization between the generally cylindrical plasma volume from one processing station to the next, irrespective of the asymmetrical wall arrangement of the chamber body itself. Accordingly, a plasma body, at least generally cylindrical in this case, is provided that is generally more uniform than what is seen in single wafer processing chambers, yet this more uniform plasma body is provided in the context of a shared or batch processing type of chamber environment.

Another benefit that is provided by shield arrangement 140 relates to the maintenance requirements of the system. It should be appreciated that such systems require significant levels of maintenance in order to maintain consistent process results. In particular, cleaning of the processing chamber must be performed at regular intervals, generally based on operational time using a specific process. It is not uncommon for such a cleaning procedure to be performed on a weekly basis or monthly basis. In this regard, it should be appreciated that there is very little free space surrounding processing stations 40 and 42 within the chamber, as is typical in such a system for reasons which include minimizing chamber interior space—a common practice in vacuum systems. Shield arrangement 140 is advantageous with respect to the capability to remove it during regular cleaning and maintenance of chamber 30, so as to significantly enhance access to the interior of the chamber. Referring to FIG. 5, first shield member 142 can be removed by opening chamber lid 32. Fasteners 155 are removed, followed by clamp ring 150. Thereafter, second shield member 142 can be removed. Each second shield member 180 can then be removed as a unit with any attached actuator arms or disengaged from the actuator arms and then removed. Moreover, the shield arrangement itself may readily be cleaned upon removal from the chamber. In one option, the shield arrangement may be disposed of and replaced by a new, clean shield arrangement. In this regard, it is noted that the cost of shield arrangement 140, as well as the shield arrangements yet to be described, is reduced at least for the reason that there is no need for the shield arrangement to maintain a pressure differential. In fact, because the shield arrangement is specifically designed to maintain a pressure equalization between the processing regions, the shield arrangement may be incapable of maintaining any significant pressure differential.

Figure 6B:
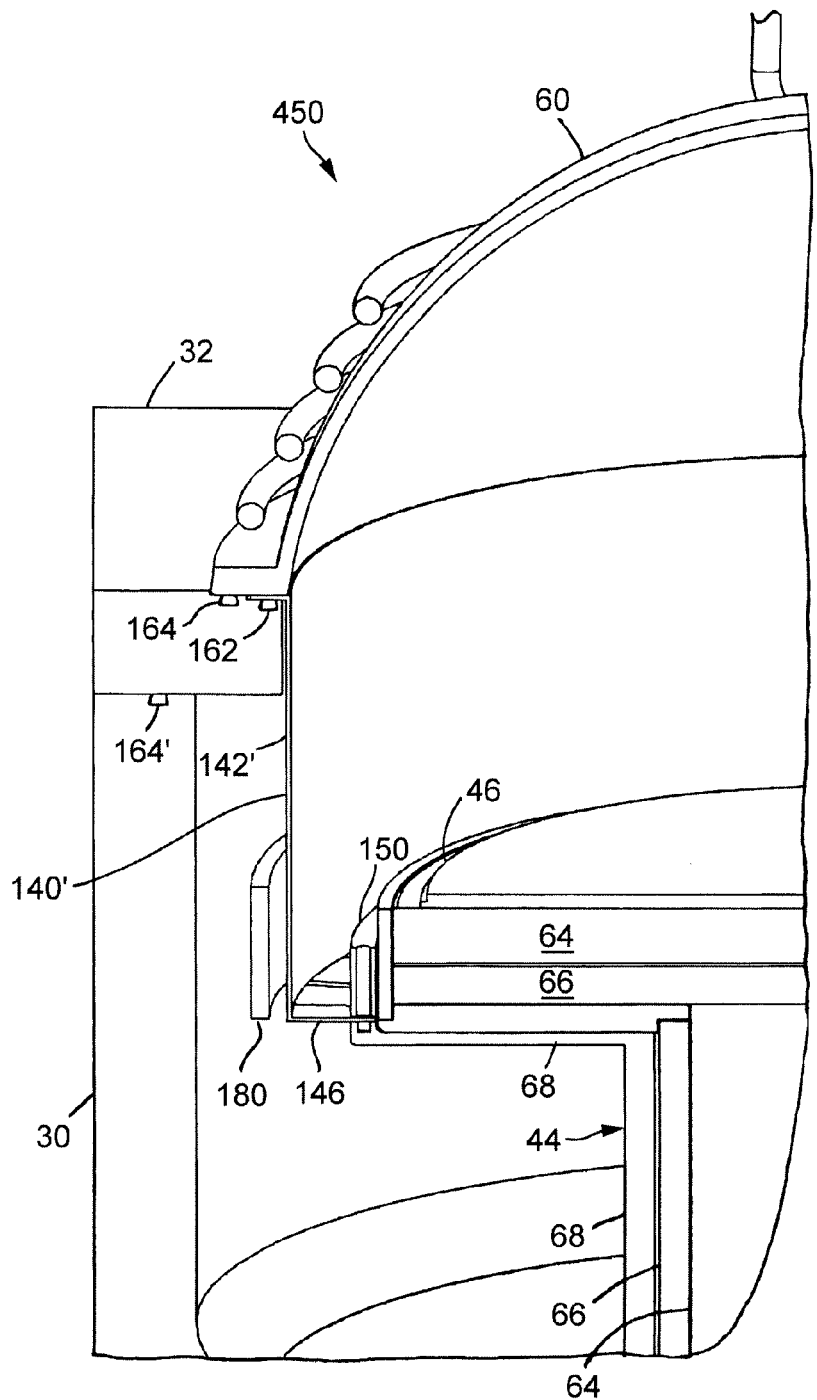
FIG. 6b is a partial cut-away diagrammatic view, in perspective, shown here to illustrate details of the embodiment of the shield arrangement of FIG. 2, shown here to illustrate details of this embodiment of the shield arrangement proximate to a sidewall of the chamber arrangement.

Referring to FIG. 6b, another embodiment is illustrated in a diagrammatic cutaway view, generally indicated by the reference number 450 which is limited to illustrating a modified shield arrangement 140' including a modified form of first shield member 142 of FIGS. 2-5, as well as the manner in which the modified shield member engages the processing chamber. It is noted that descriptions of like components, as indicated by like reference numbers, have not been repeated for purposes of brevity. Accordingly, this embodiment is similar to aforedescribed embodiment 10 with the exception that first shield member 142 has been replaced with a modified first shield member 142'. In this case, flange 160 of modified first shield member 142' is captured between source 60 and chamber lid 32. Lower groove 162 has been appropriately relocated to receive shield material 220 (see FIG. 6a). Likewise, O-ring groove 164 is positioned outward of grooves 162 to receive O-ring 222 (see FIG. 6a). An additional O-ring groove 164' is shown for forming a vacuum seal between chamber body 30 and chamber lid 32. Accordingly, embodiment 450 shares the benefits of embodiment 10, as described above. For example, modified shield arrangement 140' is selectively removable by first removing source 60 to gain access to the modified first shield member.

As will be appreciated in view of the descriptions above and further in view of embodiments yet to be described, the shield arrangement of the present disclosure in the workpiece treatment mode is composed of two physically distinct portions with one portion having a high gas conductance (HGC) with respect to gas transfer though an overall peripheral outline of the shield arrangement and another portion having a low gas conductance (LGC) with respect to gas transfer through the overall peripheral outline of the shield arrangement. Using the example of FIGS. 2-5, the low gas conductance portion corresponds to the cylindrical sidewall of first shield member 142. The high gas conductance portion corresponds to the lower end of first shield member 142 supporting web members 146. The HGC portion serves as a predominant exhaust path for flow communication with exhaust arrangement 100 which, at the same time, essentially prevents transport of charged species between processing stations. The HGC portion allows removal of reaction byproducts and other process constituents and control of the process pressure at all processing stations by a common vacuum pump and a single pressure control system thereby lowering manufacturing cost by reducing the need for control and measurement components. In the present embodiment, second shield member 180 forms part of the LGC portion, although this is not a requirement, so long as at least one part of one of the HGC and LGC portions is movable. In the treatment or processing mode, which can be considered as the closed position for one of the shield members, the HGC and LGC portions of the shield cooperate to act as a selectively transparent shield (STS). That is, transport of charged species between processing stations is essentially blocked, whereas neutral species are able to move between processing stations. The transport of light between processing stations is likewise blocked absent any reflections, as will be further discussed below.

The LGC portion can include circuitous paths that are defined between shield members in the treatment mode as seen throughout the various figures. Such a circuitous path acts as a barrier to effectively block the passage of charged species such as ions, while allowing the passage of neutral gas species. Such discrimination is provided by the small transverse dimension of the path compared to the collisional mean free path of the particles, and the bends in the path which require a particle to change direction, which guarantees that almost every particle (neutral or charged) has to collide with a wall. In the result of the collision with the wall, a neutral particle simply changes the direction of its motion, while an ion loses or acquires an electron and becomes neutral. Accordingly, the LGC portion operates as a selective shield as it does allow neutral gaseous constituents from the process ambient to leak through the circuitous path that is cooperatively defined between the adjacent shield members in each embodiment. Further, shield members which form the LGC portion may be equipped with various hardware features (such as coils and/or channels for cooling and/or heating using heat exchange liquids or gases) to allow the entire shield arrangement to be maintained at a desired temperature that is beneficial to achieving optimal desired processing results (such as control of process repeatability, reduced contamination, control of particles and/or deposits resulting from condensation of process reaction constituents). It also is generally designed to have a high thermal conductivity, to conduct heat to the cooled areas without significant temperature variation. The LGC portion can also be cooled by thermal conduction to surrounding chamber features such as, for example, through grounding connections.

Considering the HGC portion in more detail, in the treatment mode, the HGC portion cooperates with the LGC portion to provide many of the benefits of the shield as two parts of one whole. For example, the HGC portion can complete the near axisymmetric grounded surface (about an axis of symmetry or centerline of the workpiece pedestal assembly) having a low impedance ground path connection extending from the top surface of the process chamber to the grounded surface of the workpiece pedestal assembly. The HGC portion comprises those portions of the shield arrangement that have a very high conductance of neutral gas species, while the LGC portion comprises the portions of the shield arrangement with less or lower gas conductance, as is required to produce the desired axisymmetric gas flows in the processing volumes.

Figure 7:
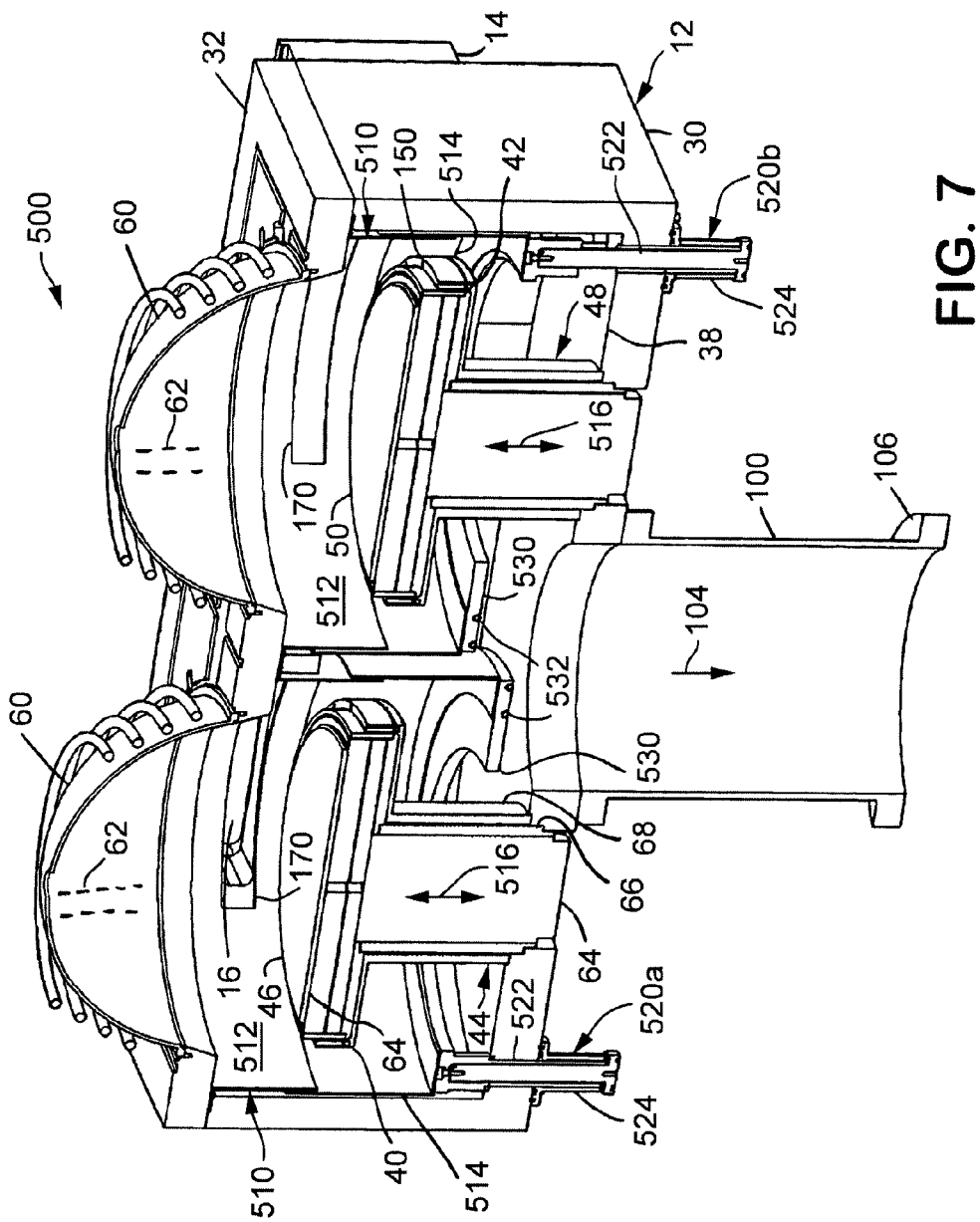
FIG. 7 is a partial cut-away, diagrammatic view, in perspective, of the processing chamber arrangement of FIG. 1, shown here to illustrate details with respect to its construction, including a second embodiment of a shield arrangement that is used for each processing station of the processing chamber arrangement.

Attention is now directed to FIG. 7 which illustrates another embodiment of a processing chamber arrangement, generally indicated by the reference number 500. Processing chamber arrangement 500 includes a number of components previously described above. Accordingly, descriptions of these like components will not be repeated for purposes of brevity. Further, processing chamber arrangement 500 shares the benefits that are provided by processing chamber arrangement 10, as described above and may provide still further benefits. The present embodiment includes a shield arrangement 510 that is made up of a first shield member 512 and a second shield member 514. One of the shield arrangements is provided for each processing station. First shield member 512 may be configured in essentially the same manner as first shield member 142, as described above, except that web members 146 (see, for example, FIG. 5) are optional. First shield member 512 may engage chamber lid 32 and chamber body 30 using peripheral flange 160 as shown, for example, in FIG. 6a. Like first shield member 142, described above, first shield member 512 can include a generally cylindrical peripheral outline that defines workpiece transfer slot 170 and an axis of symmetry 516. An additional, opposing slot may be provided with the attendant advantages described above. Moreover, the additional slot can be addressed by second shield member 514 in a manner that is essentially identical to that which slot 170 is addressed by second shield member 514.

With continuing reference to FIG. 7, second shield member 514 of each shield arrangement 510 is supported for movement in a direction at least generally along axis 516 to move second shield member 514 between a workpiece transfer position and a workpiece treatment position in a non-contacting confronting spaced apart relationship with the first shield member. In this regard, second shield member 514 is shown in the workpiece transfer position for processing station 40 and is shown in the workpiece treatment position for processing station 42, as an illustrative expedient. Generally, second shield members 514 can be moved in unison between the workpiece transfer and workpiece treatment positions. In the present embodiment, actuator arm arrangements 520a and 520b are illustrated, each of which engages a respective one of second shield members 514. It is noted that each actuator arm arrangement includes a shaft 522 and an expandable bellows 524 for purposes of sealing interior 38 of the processing chamber from its ambient surroundings. Further, in this embodiment, each of second shield members 514 includes an inwardly extending peripheral baffle 530 each of which can define cooling channels 532 for supporting a flow of cooling fluids such as, for example, ethylene glycol, deionized water, a chemically inert fluid or a gas such as nitrogen or air. It is noted that the temperature of the various surfaces of the shield arrangement that bound the treatment volume may influence processing conditions and, thereby, process results. For example, during a processing run in which an entire set of workpieces is sequentially processed, the temperature of the shield arrangement may tend to increase. Cooling expedients to maintain the temperature of the shield arrangement may therefore be of benefit. As illustrated, each peripheral baffle 530 includes a width which varies around its associated processing station, as will be further described immediately hereinafter. It is noted that the temperature of the shield components may influence the degree to which reaction byproducts and reactants adsorb to or react with their surfaces, potentially forming thin layers of material that might later peel and cause undesired particulation. In this regard, it is believed that an unstable surface temperature may increase the chances of particulation and film formation. Accordingly, it may be of benefit to maintain a more stable temperature, for example, by cooling the shield arrangement.

With regard to peripheral baffle 530, it can be seen that exhaust arrangement 100 is positioned between processing stations 40 and 42. In other words, the exhaust arrangement, like the arrangement of sidewalls of chamber body 30, is asymmetrically positioned with respect to each of the processing stations. This can result in different rates of flow peripherally around the pedestal of each processing station to the exhaust arrangement with higher flow rates nearer to the exhaust arrangement. In order to compensate for these varying rates, baffle 530 can be configured to increasingly constrict the flow around each pedestal relatively nearer to the exhaust arrangement. Stated in another way, baffle 530 provides additional conductance to the exhaust channel with increasing distance from the exhaust arrangement. Accordingly, baffle 530 provides for an equalized rate of exhaust flow pumping distributed around the pedestal of each processing station. Essentially, shield arrangement 510, like aforedescribed shield arrangement 140, cooperates with baffle 530 to produce a uniform or more uniform azimuthal process volume and arrangement of surfaces around each processing station peripheral to each workpiece holder (i.e., susceptor) and between each workpiece holder and its respective treatment source. At the same time, baffle 530 creates a non-uniform azimuthal process space between the workpiece holder and the offset exhaust channel that cooperates to still further influence the more uniform process volume in a positive way. That is, the presence of baffle 530 can provide additional enhancements in process uniformity, as will be further discussed at an appropriate point below.

Figure 8A:
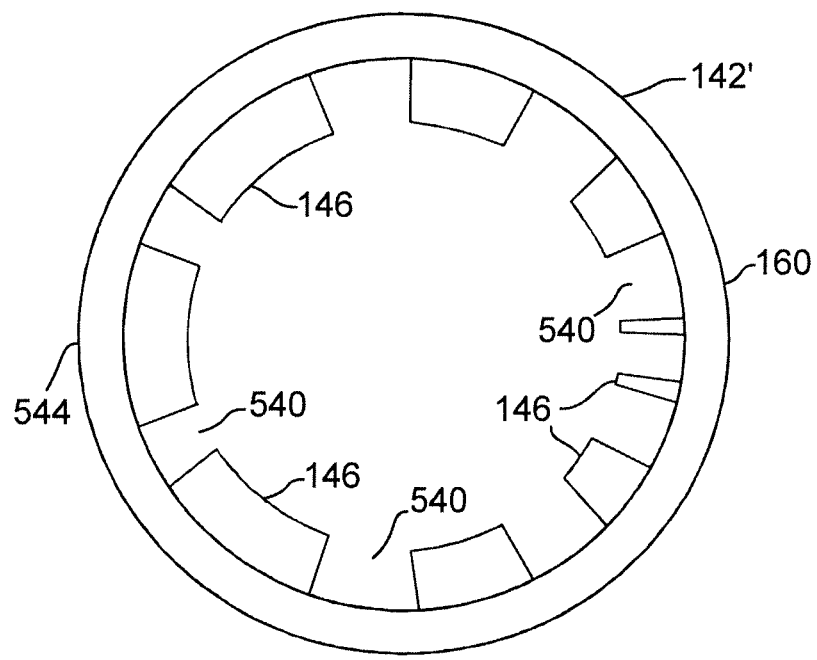
FIGS. 8a and 8b are diagrammatic plan views of modified shield members that may be used in the shield arrangements of FIGS. 2 and 7, as well as in other embodiments of the shield arrangement that are described herein.

Referring again to FIGS. 2-6a, in view of FIG. 7 and its associated description, it should be appreciated that embodiment 10 may incorporate a baffle arrangement and share in the benefits of such a baffle arrangement as described with respect to embodiment 500. Further, referring to FIG. 8a, in one implementation, a modified first shield member 142' of shield arrangement 140 is shown in a diagrammatic plan view. Modified shield member 142' is configured such that web members 146 (several of which are identified by reference numbers), define apertures 540 (several of which are identified by reference numbers) therebetween, that are of different areas in order to cooperatively function in essentially the same manner as baffle 530, described above. In this regard, a leftmost edge position 544 of the modified first shield member would likely be positioned nearest the exhaust channel.

Figure 8B:
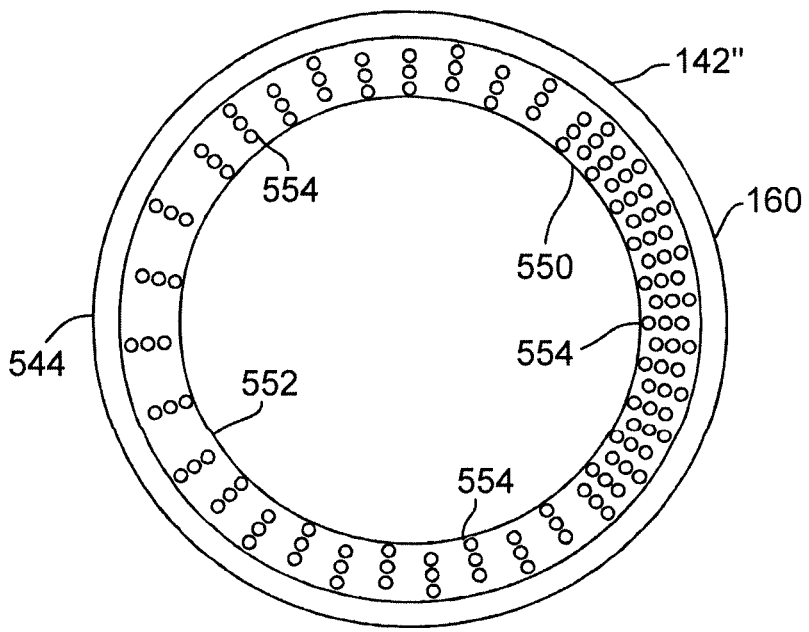

Referring to FIG. 8b, in another implementation, a modified first shield member 142" of shield arrangement 140 is shown in a diagrammatic plan view. Modified shield member 142" is configured having a plasma control grid 550 in the configuration of a ring having an inner periphery 552 that can be engaged by clamp ring 150 (see, for example, FIG. 4) such that web members 146 (several of which are identified by reference numbers), and including aforedescribed flange 160. In this example, plasma control grid 550 replaces web members 146 and defines a plurality of apertures 554 that are distributed around the periphery of the plasma control grid to cooperatively function in essentially the same manner as baffle 530, described above. Further, plasma containment grid 550, as is also the case with respect to web members 146, serves to avoid a plasma igniting below the shield arrangement. In this regard, the plasma control grid is formed from an electrically conductive material such as, for example, aluminum, which may be anodized. Second shield member 142", like shield members 142' and 142, may be integrally formed or formed in sections that are attached to one another. For example, flange 160 and plasma control grid 500 may be welded to opposing ends of a cylindrical body.

Figure 9A:
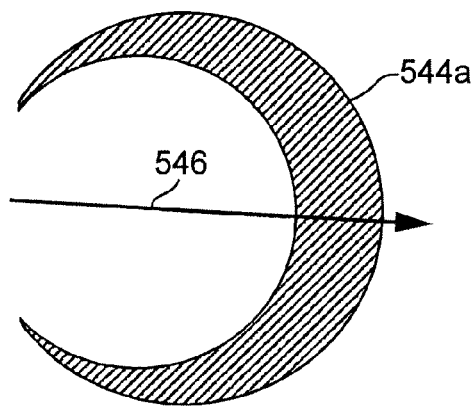
FIGS. 9a-c are diagrammatic plan views of additional embodiments of baffle arrangements that may be used in conjunction with any of the shield arrangements that are described in this overall disclosure and which may benefit from such use.
Figure 9B:
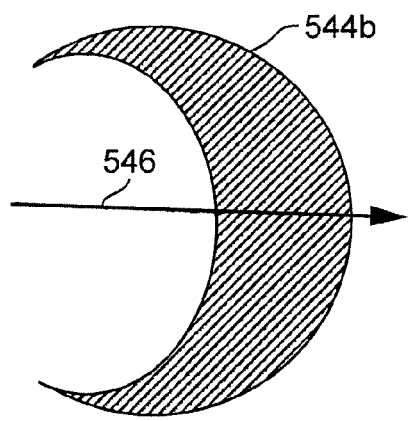
Figure 9C:
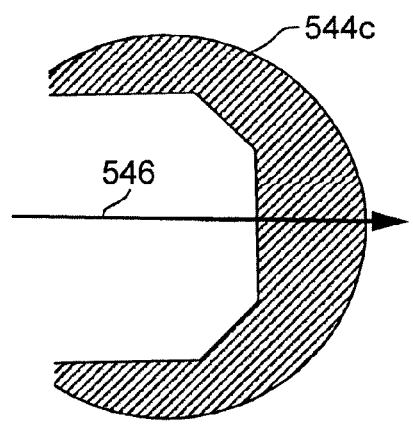

Turning to FIGS. 9a-c, attention is directed to a number of embodiments of baffle arrangements, in diagrammatic plan views, that may be used in place of baffle arrangement 530 of FIG. 6a or, likewise, in conjunction with any of the shield arrangements that are described in this overall disclosure. The various baffle configurations are designated by the reference numbers 544a, 544b and 544c in FIGS. 9a, 9b and 9c, respectively. In each case, an arrow which is indicative of a line of symmetry 546 of each baffle, when installed, for example, as part of a shield arrangement, points in a direction toward the exhaust channel and may bisect the exhaust channel. Moreover, a wide variety of other shapes may be used in view of this overall disclosure that may be customized in view of a particular application and in view of this overall disclosure.

It should be apparent, from the descriptions above, that the shield arrangements described herein serve to provide a more uniform azimuthal process space (and, likewise, more uniform arrangement of surfaces) around each processing station when enclosed and held in pressure isolation by a processing chamber that is necessarily asymmetric and shared by two or more processing stations. The more uniform azimuthal processing space serves to control processing parameters that include the density, flow and residence time of process reactants and byproducts such that the major surface of each workpiece is subjected to more constant azimuthal distributions of these processing parameters, against the major surface of the workpiece that is being treated, than the parameter distributions that would be provided by the processing chamber itself. From a processing station to processing station standpoint, in a given processing run, each workpiece at each processing station is therefore exposed to near identical process conditions in order to affect near identical process results across all workpieces processed at the same time in a single process chamber and irrespective of the asymmetric processing chamber. Concurrently, in order for each workpiece at each process station within the process chamber to experience essentially identical processing conditions, each workpiece is subjected to the same process pressure at each process station, since identical process pressure is believed to be a factor in achieving near identical process results. Accordingly, as described above, each workpiece at each processing station is caused to experience the same process pressure by causing that pressure to equilibrate between processing stations through the use of one or more circuitous and non-line-of-sight paths. These circuitous paths restrict ionized gas species by forcing gas particles to make several changes in their trajectory, which forces ionized particles to collide with surfaces thereby losing their energy and charge. Accordingly, the shield arrangements serve to confine the plasma from each plasma source, while advantageously allowing pressure equalization.

At the same time, the shield arrangement, below the work piece holder and at least somewhat remote from the region in which the plasma is contained, may include a baffle to insure uniform flow around each of the work piece holders and to balance the flow from each processing station to a single exit/exhaust port from the process chamber. This exit port may communicate, for example, with a pressure control throttle valve (not shown) and a gas pumping system (not shown) to regulate pressure to a desired level (typically subatmospheric).

As will now be appreciated, a highly advantageous system is provided which accommodates high throughput without a need to resort to the use of a single process chamber environment by selectively controlling movement of individual components of process related products between process stations in a common/shared processing chamber and associated environment.

Figure 10:
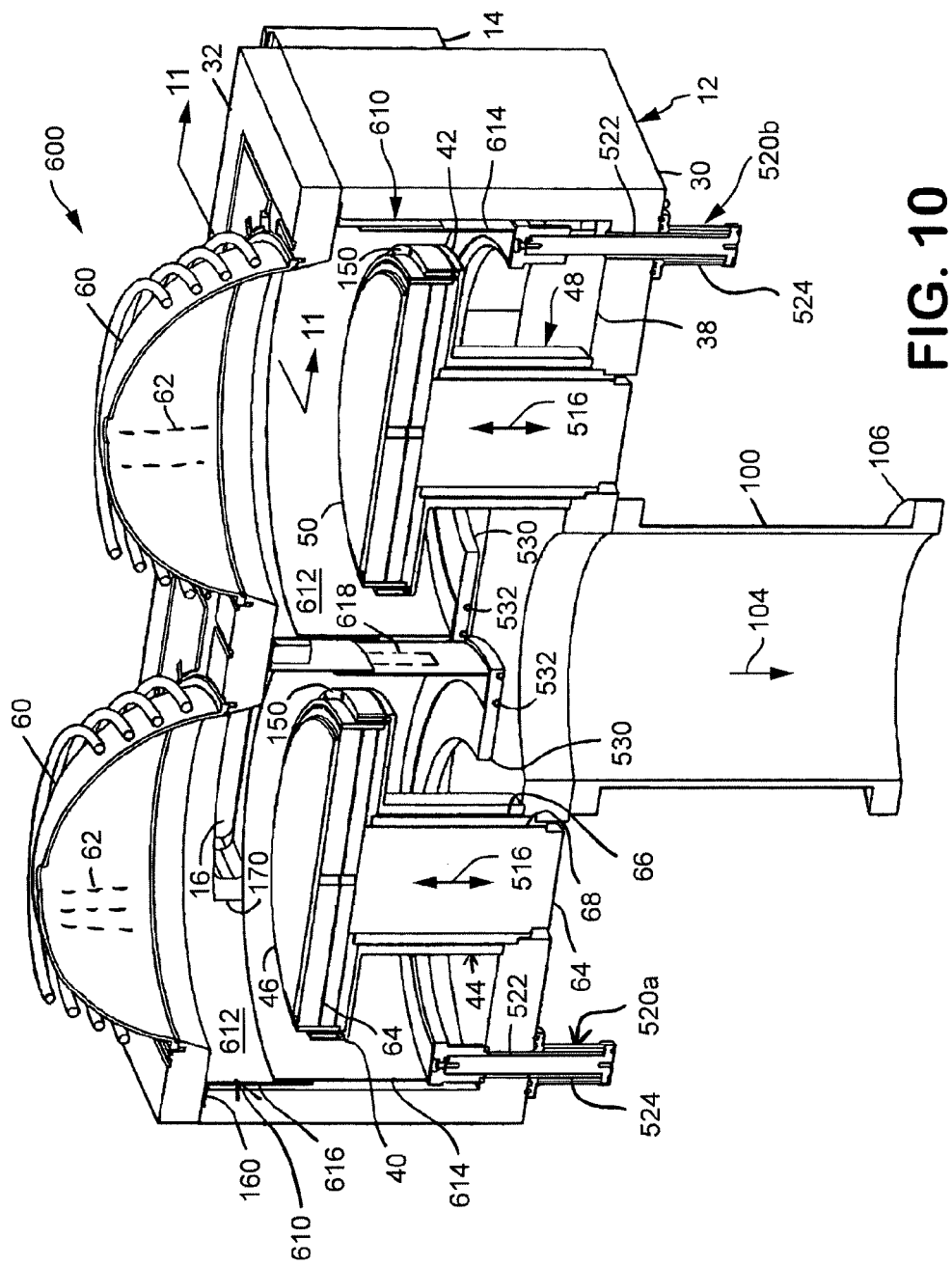
FIG. 10 is a partial cut-away, diagrammatic view, in perspective, of the processing chamber arrangement of FIG. 1, shown here to illustrate details with respect to its construction, including a third embodiment of a shield arrangement that is used for each processing station of the processing chamber arrangement.

Attention is now directed to FIG. 10 which illustrates another embodiment of a processing chamber arrangement, generally indicated by the reference number 600 and is shown in a diagrammatic, perspective cutaway view looking through the interior of the chamber toward the front of the chamber where slit valve arrangement 14 is installed. Processing chamber arrangement 600 includes a number of components previously described above. Accordingly, descriptions of these like components will not be repeated for purposes of brevity. Further, processing chamber arrangement 600 shares the benefits that are provided by processing chamber arrangements 10 and 500, as described above and may provide still further benefits. The present embodiment includes a shield arrangement 610 that is made up of a first shield member 612 and a second shield member 614. In this example, each of the first and second shield members, between its opposing ends, includes an at least generally cylindrical peripheral outline. One of the shield arrangements is provided for each processing station. The shield arrangement for processing station 40, on the right side of the figure, is shown in a workpiece transfer mode, whereas the shield arrangement for processing station 42, on the left side of the figure, is shown in a workpiece treatment mode. First shield member 612 maybe configured in essentially the same manner as first shield member 142, as described above, except that it does not include web members. For reasons which will become evident, first shield member 612 can include a generally cylindrical body 616 that supports aforedescribed flange 160 (see also, for example, FIGS. 5 and 6a). It is noted that web members 146 (see FIGS. 2, 3 and 5) may also be used in this embodiment through a design that interlaces the web members which are a part of the shield member 610, through cutouts 618 (one of which is shown using dashed lines) in moving shield member 614. First shield member 612 may engage chamber lid 32 and chamber body 30 using peripheral flange 160 as shown, for example, in FIG. 6a. Like first shield member 142, described above, first shield member 612 can include a generally cylindrical peripheral outline that defines workpiece transfer slot 170 and axis of symmetry 516. An additional, opposing slot may be provided with the attendant advantages described above. Moreover, the additional slot can be addressed by second shield member 614 in a manner that is essentially identical to that which slot 170 is addressed by second shield member 614.

With continuing reference to FIG. 10, second shield member 614 of each shield arrangement 610 is supported for movement in a direction at least generally along axis 516 to move second shield member 614 between a workpiece transfer position and a workpiece treatment position. In this regard, second shield member 614 is shown in the workpiece transfer position for processing station 40 and is shown in the workpiece treatment position for processing station 42, as an illustrative expedient. Unlike the aforedescribed shield arrangements, however, in shield arrangement 610, second shield member 614 moves within the interior of first shield member 612 along axis 516 since the second shield member includes a diameter that is less than the diameter of the first shield member. Generally, second shield members 614 will be moved in unison between the workpiece transfer and workpiece treatment positions, although this is not required. In the present embodiment, actuator arm arrangements 520a and 520b are illustrated, each of which engages a respective one of second shield members 614. Again, each actuator arm arrangement includes a shaft 522 and an expandable bellows 524 for purposes of sealing interior 38 of the processing chamber from its ambient surroundings. In this embodiment, however, baffle 530 can be supported by a lower periphery of each second shield member 614 and move therewith.

Figure 11:
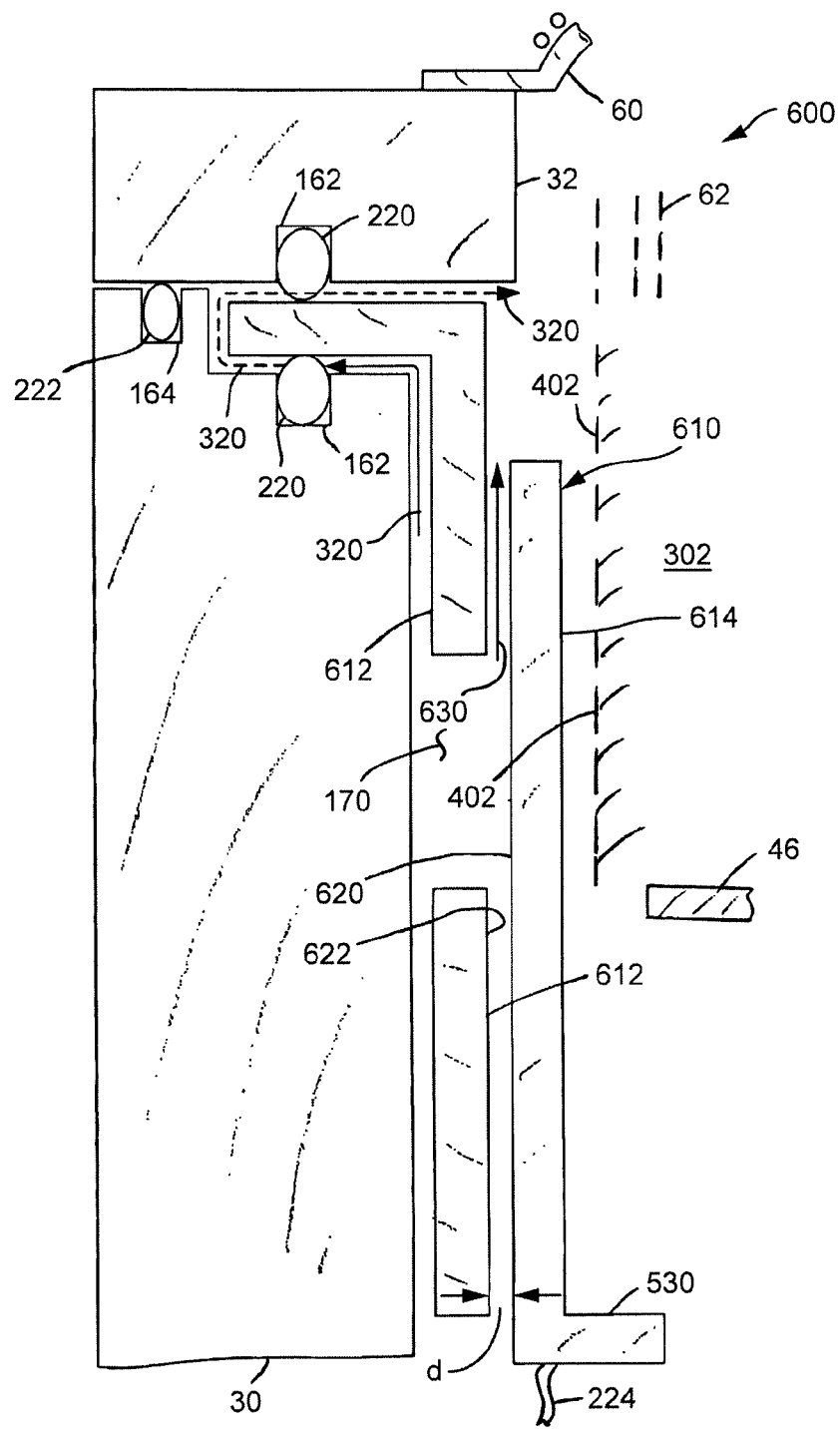
FIG. 11 is a partial cut-away diagrammatic view, in elevation, shown here to illustrate details of the embodiment of the shield arrangement of FIG. 10 proximate to a workpiece transfer slot.

Referring to FIG. 11, a diagrammatic illustration is provided, in cross-section, taken along a line 11-11 in FIG. 10, showing additional details of shield arrangement 610 including first shield member 612 and second shield member 614 with the latter in the treatment position, adjacent to workpiece transfer slot 170. Appropriate portions of chamber body 30 and chamber lid 32 are also shown. It is noted that descriptions of components shown in previous figures and described above may not be repeated for purposes of brevity. Again, one or more flexible straps 224 can be used to ground second shield member 614, as well as actuator arms 522 of FIG. 10. It should be appreciated that an outer surface 620 of the second shield member is in a spaced apart relationship at distance d from an inner surface 622 of the first shield member. With respect to an ion attempting to travel into interior 302 of shield arrangement 610 through slot 170, distance d can be made small relative to a length of any path along which an ion may attempt to travel to reduce the probability of successful travel by that ion to near zero. For example, if an ion attempts to travel along a path 630, illustrated by an arrow, there can be a nearly overwhelming probability that the ion (i.e., charged species) will be attracted to one or the other of surfaces 620 and 622, thereby ending its travel, when d is made sufficiently small in comparison to the length of path 630. On the other hand, neutral species can readily transit along path 630 to facilitate processing station to processing station pressure equalization. It is noted that the presence of slot 170 outside of second shield member 614 may have an essentially indiscernible effect on plasma volume 402 in the treatment position. Stated in another way, there may be no azimuthal influence by slot 170 in this embodiment, at least from a practical standpoint, essentially creating an even more symmetrical plasma body since paths such as aforedescribed path 630 can be much longer than distance d.

Figure 12:
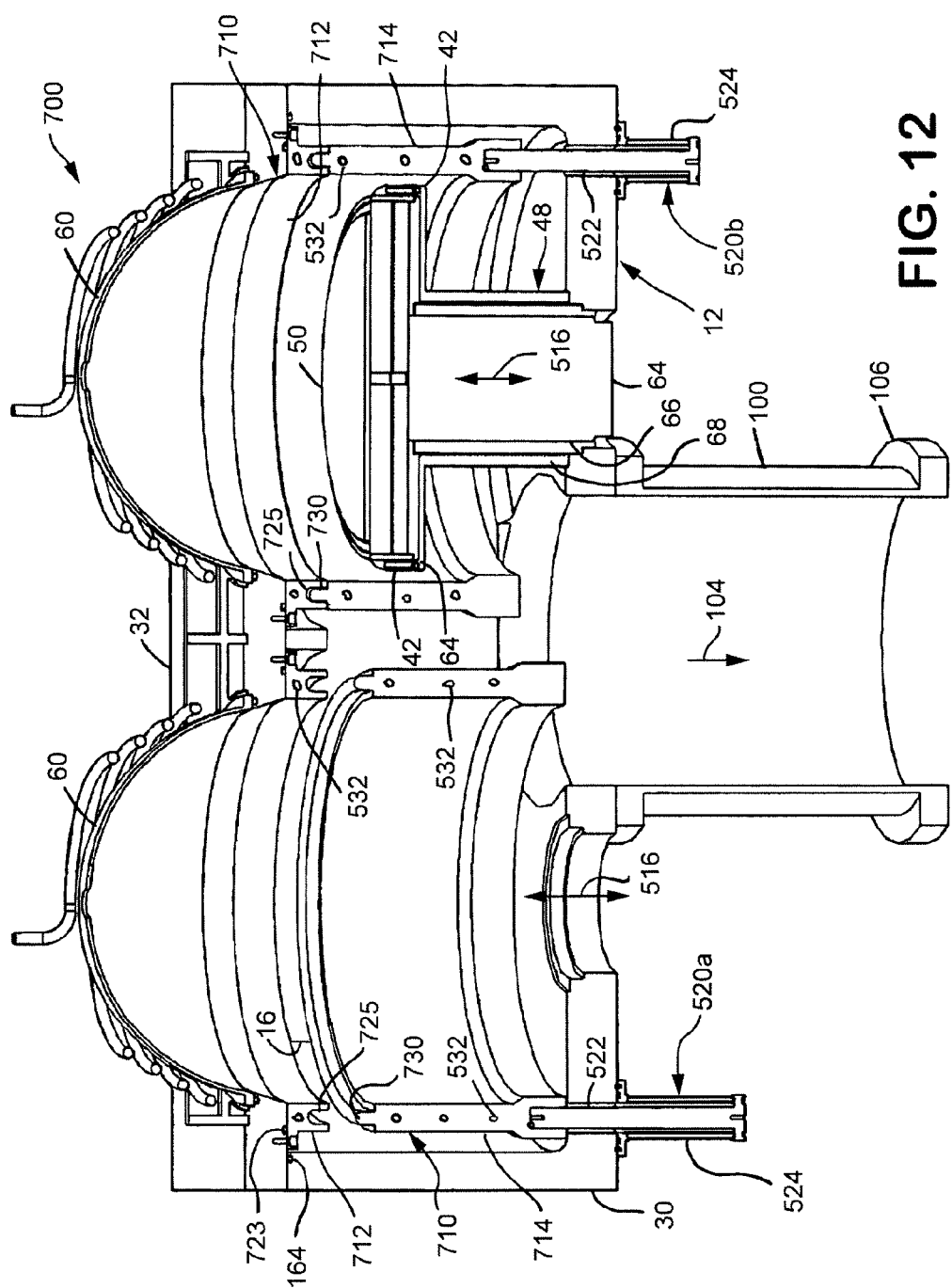
FIG. 12 is a partial cut-away, diagrammatic view, in perspective, of the processing chamber arrangement of FIG. 1, shown here to illustrate details with respect to its construction, including a fourth embodiment of a shield arrangement that is used for each processing station of the processing chamber arrangement.

Turning to FIG. 12, another embodiment of a processing chamber arrangement is generally indicated by the reference number 700, shown in a diagrammatic, perspective cutaway view with the back of the chamber and lid removed and looking toward the front of the chamber where slit door 16 is located. Processing chamber arrangement 700 includes a number of components previously described above. Accordingly, descriptions of these like components may not be repeated for purposes of brevity. Further, processing chamber arrangement 700 shares the benefits that are provided by processing chamber arrangements 10, 500 and 600, as described above and may provide still further benefits. The present embodiment includes a shield arrangement 710 that is made up of a first shield member 712 and a second shield member 714. It is noted that the processing station on the left side of this figure has been removed in order to best illustrate details of shield arrangement 710. As in previous examples, the shield arrangement on the left side of the figure is shown in the workpiece transfer position, whereas the shield arrangement on the right side of the figure is shown in the workpiece treatment position. In this example, each of the first and second shield members, between its opposing ends, can include an at least generally cylindrical peripheral outline. One of the shield arrangements is provided for each processing station.

Figure 13:
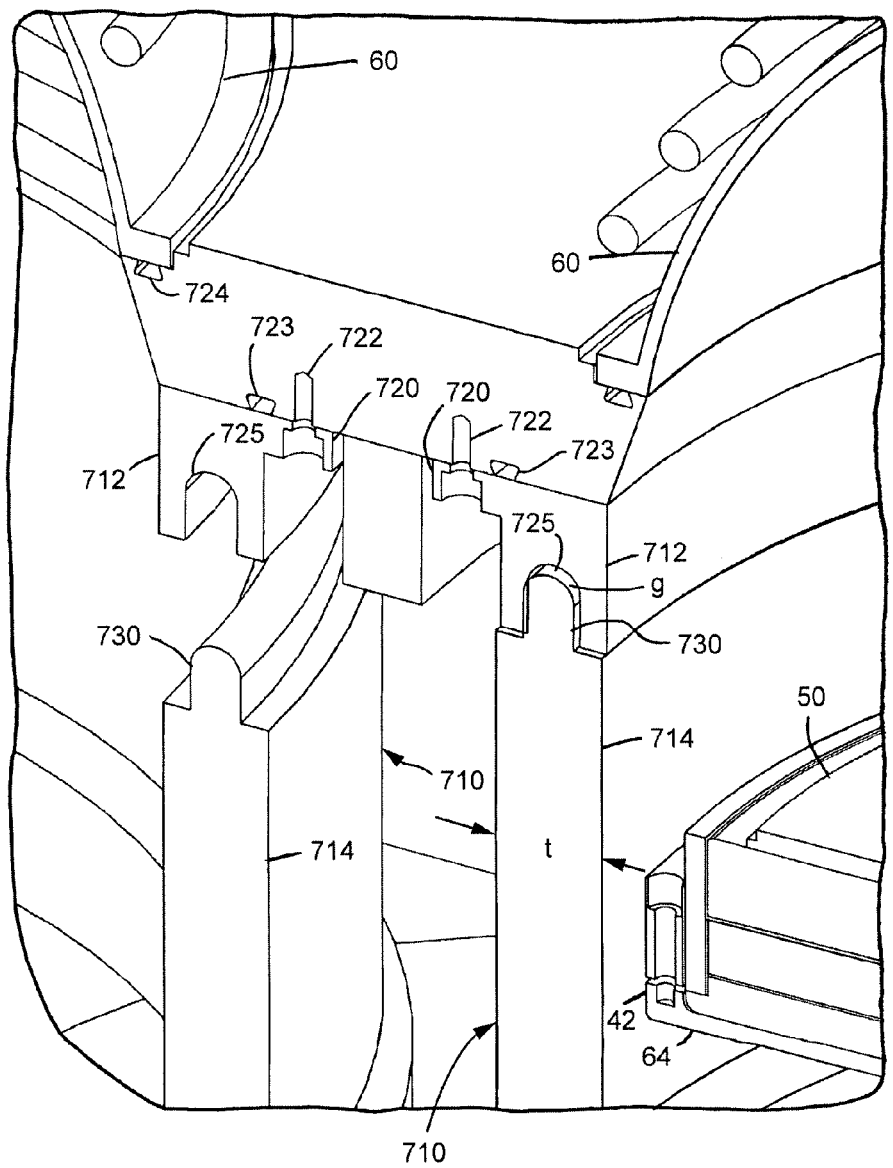
FIG. 13 is a partial cut-away diagrammatic view, in elevation, shown here to illustrate details of the embodiment of the shield arrangement of FIG. 12.

Referring to FIG. 13, in conjunction with FIG. 12, the former is a diagrammatic, cutaway view, in perspective, showing further details of shield arrangement 710. First shield member 712 may be attached to chamber lid 32, for example, using a peripheral flange 720 (best seen in FIG. 13) having holes 722 that are cooperatively defined by flange 720 and chamber lid 32, which holes can receive appropriate fasteners (not shown). Aforedescribed radio frequency shielding material 220 (see, for example, FIG. 11) may be received in a groove 723 for insuring that first shield member 712 is electrically connected to lid 32. It is noted that each source 60 may be sealed to chamber lid 32 using an O-ring (not shown) that is positioned in a groove 724. When mounted to the chamber lid, an upper opening of each first shield member faces each source 60. A lower opening of each first shield member faces a respective processing station. Each first shield member 712 and each second shield member 714 can include a thickness t between its opposing ends. Within thickness t, a lower edge of each first shield member 712 can define a groove 725. An upper edge of second shield member 714 opens towards first shield member 712. Further, the upper edge of second shield member 714 can form a tongue 730. As seen in FIG. 13, movement of second shield members 714 can be accomplished along axis of symmetry 516 using actuator arms 522. While the second shield members can be moved independently, they are generally moved in unison. In this regard, the second shield members can share a single actuator and use an appropriate linkage thereto. Actuator arms 522 may be removably received in second shield members 714. In one embodiment, each actuator arm and associated second shield member 714 can be removed and installed in the processing chamber as a unit.

Still referring to FIGS. 12 and 13, during movement of each second shield member 714, relative to its associated first shield member 712, the upper end of the second shield member moves towards and away from the lower end of first shield member 712 in a confronting relationship. In the workpiece transfer position, sufficient space is defined between the first and second shield members to provide for workpiece transfer therethrough. In the workpiece treatment position (best seen in FIG. 13), tongue 730 of second shield member 714 is received in groove 725 of first shield member 712 in a non-contacting but close relationship in order to avoid rubbing which would generate particles. In this way, a gap g is defined such that a circuitous path is formed in the workpiece treatment position between the first and second shield members. Accordingly, when the second annular shield member is in the workpiece treatment position, the tongue extends into the groove in a non-contacting manner to define a circuitous path from any position interior to each shield arrangement to any position exterior to that shield arrangement in order to essentially block ion flow, while providing for the transport of neutral species such that treatment pressures are equalized between the processing stations. It should be appreciated that many other variations with respect to the shape of this circuitous path are possible in the context of these teachings and the particular shape that is shown is provided by way of non-limiting example. If desired, a lower end of each second shield member can be configured to include or support an appropriate baffle such as, for example, baffle 530 described above. Accessing shield arrangement 710 for removal, installation and chamber cleaning purposes is readily accomplished by simply opening chamber lid 32. For cleaning, first shield member 712 is removed from the chamber lid and second shield member 714 is removed from chamber body 714.

Figure 14:
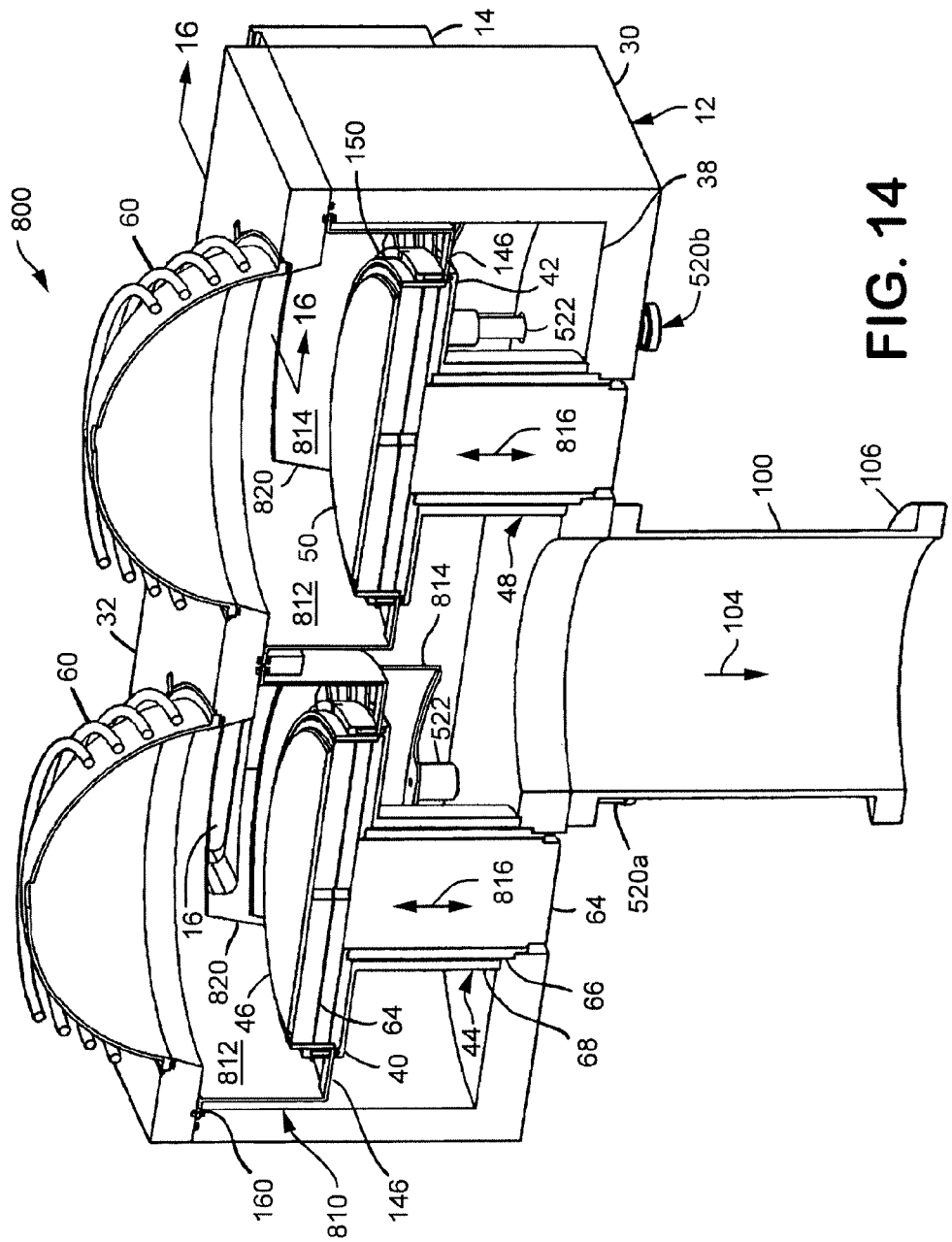
FIG. 14 is a partial cut-away, diagrammatic view, in perspective, of the processing chamber arrangement of FIG. 1, shown here to illustrate details with respect to its construction, including a fifth embodiment of a shield arrangement that is used for each processing station of the processing chamber arrangement.
Figure 15:
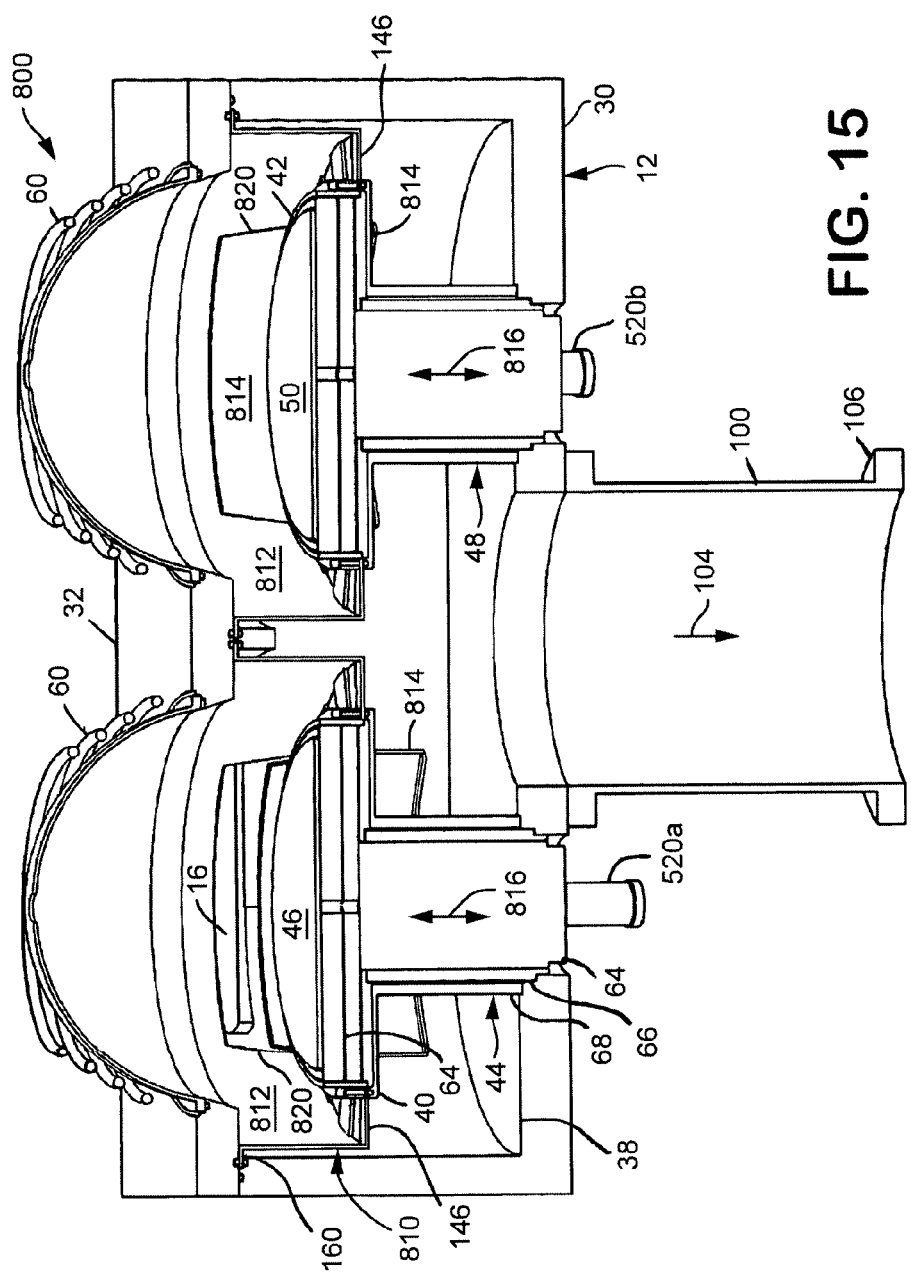
FIG. 15 is another partial cut-away diagrammatic view, in perspective, shown here to illustrate details of the embodiment of the shield arrangement of FIG. 14.

Attention is now directed to FIGS. 14 and 15 which illustrates another embodiment of a processing chamber arrangement, generally indicated by the reference number 800. FIG. 14 shows processing chamber arrangement 800 in a diagrammatic, perspective cutaway view with the back of the chamber and lid removed and looking toward the front of the chamber where slit door 16 is located, while FIG. 15 provides a view from more directly behind processing chamber arrangement 800. Processing chamber arrangement 800 includes a number of components previously described above. Accordingly, descriptions of these like components may not be repeated for purposes of brevity. Further, processing chamber arrangement 800 shares the benefits that are provided by processing chamber arrangements 10, 500, 600 and 700 as described above and may provide still further benefits. The present embodiment includes a shield arrangement 810 that is made up of a first shield member 812 and a second shield member 814. As in previous examples, the shield arrangement on the left side of each figure is shown in a workpiece transfer mode, whereas the shield arrangement on the right side of each figure is shown in the workpiece treatment mode. In this embodiment, first shield member 812 includes a sidewall that defines a peripheral outline enclosing one of the workpieces which is supported by one of the processing stations. The elongated first shield member defines an opening that faces a respective one of the treatment sources and an opposing opening which can be situated, in the view of the figure, vertically below the location of the workpiece. The first shield member can define its peripheral outline as cylindrical in configuration having an axis of symmetry 816. Further, the first shield member defines a sidewall door 820 that extends downward to adjoin the opening at the bottom of the first shield member. One of the shield arrangements is provided for each processing station.

Figure 16:
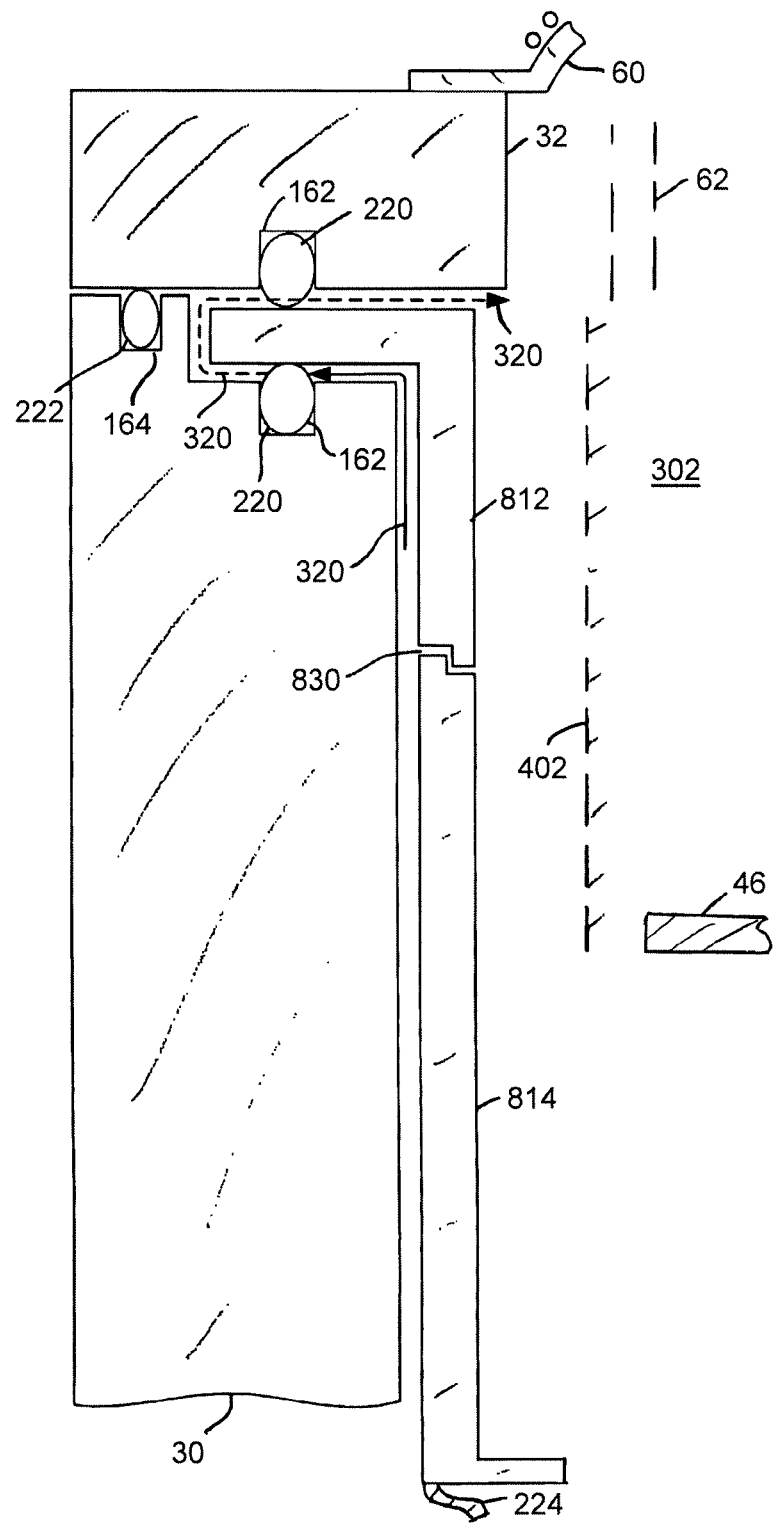
FIG. 16 is a partial diagrammatic view, in cross-section, taken along a line 16-16 in FIG. 14, shown here to illustrate details with respect to the shield arrangement.

Referring to FIG. 16, in conjunction with FIGS. 14 and 15, the former is a diagrammatic partial view, in cross section, taken along a line 16-16 in FIG. 14, showing further details of shield arrangement 810. First shield member 812 may engage chamber lid 32 and chamber body 30 using peripheral flange 160 as shown and described above. Second shield member 814 of each shield arrangement 810 is supported for movement in a direction at least generally along axis 816 to move the second shield member between a workpiece transfer position and a workpiece treatment position. In this regard, second shield member 814 is shown in the workpiece transfer position for processing station 40 and is shown in the workpiece treatment position for processing station 42, as an illustrative expedient. The second shield member is generally configured with a curvature, in a plan view, that matches the curvature of first shield member 812, as will be illustrated in a subsequent figure, and has a peripheral edge configuration that is complementary to the general edge configuration of sidewall door 820. Movement along axis 816, therefore, moves second shield member into and out of sidewall door 820 to place the respective edges of the second shield member in a confronting relationship with corresponding ones of the edges of the sidewall door in the wafer transfer position and to expose wafer transfer slot 16 in the workpiece transfer position. Any suitable complementary edge configuration can be used for the shield members in implementing the sidewall door so long as the respective edges are placed in a confronting relationship in the treatment position and can be moved, without interference, to the workpiece transfer position. For example, the sidewall door can be in the shape of an inverted U. Generally, second shield members 814 will be moved in unison between the workpiece transfer and workpiece treatment positions, although this is not required. In the present embodiment, actuator arm arrangements 520*a* and 520*b* are illustrated, each of which engages a respective one of second shield members 814 using actuator arms 522 (FIG. 14).

Referring to FIG. 16, the sidewall door of first shield member 812 includes an edge profile which cooperates with an edge profile of second shield member 830 to define a circuitous path 830 for any particle attempting to travel therethrough. Accordingly, as described above, neutral species can transit this path while ions will generally be blocked. While circuitous path 830 is configured with two right angle turns, it should be appreciated that any suitable non-line-of-sight shape can be used.

Figure 17:
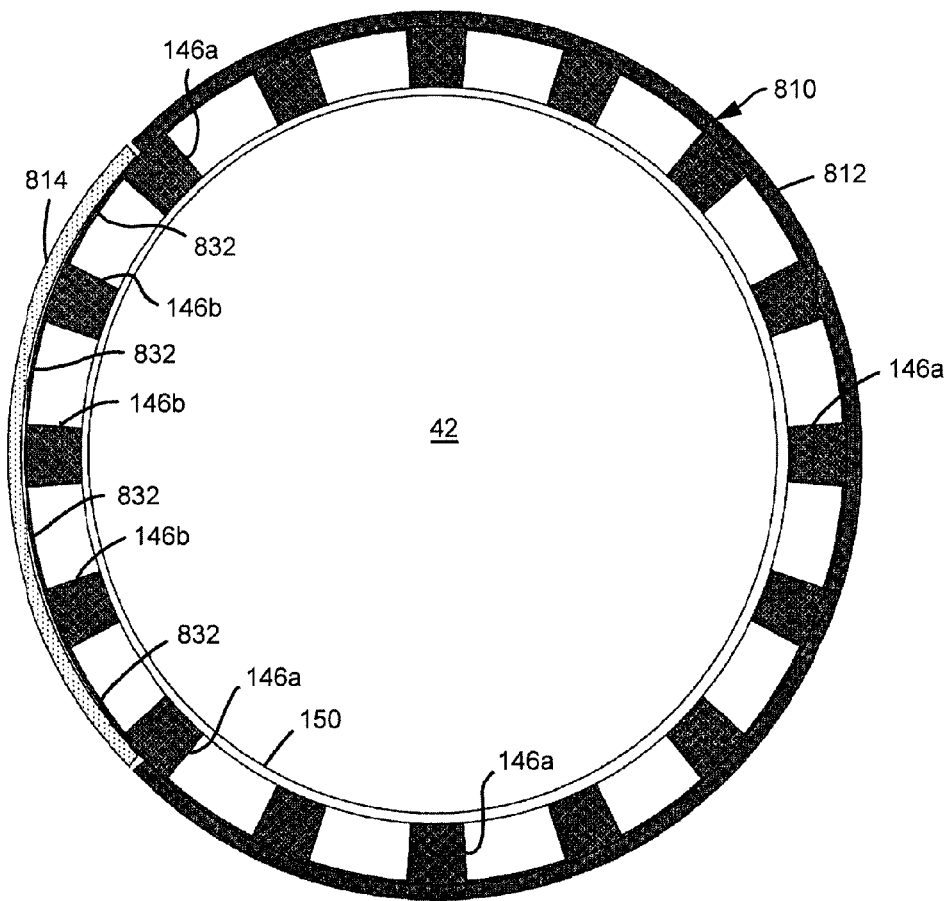
FIG. 17 is a diagrammatic plan view of the shield arrangement of FIG. 14, shown here to illustrate further details of its structure including one exemplary way in which shield web members can be configured adjacent to a movable second shield member.

Turning to FIG. 17, an isolated plan view of treatment station 42 is shown including shield arrangement 810 with first shield member 812 and second shield member 814 wherein the curvature of the second shield member matches that of the first shield member. It is noted that the shield members are shown in the workpiece treatment position, however, circuitous path 830 has not been shown due to illustrative constraints, although it is understood to be present. It is noted that certain provisions are made with respect to aforedescribed web members 146 in view of the movement of second shield member 814. In particular, web members 146*a* (a number of which are designated using reference numbers) can be engaged at their inner ends by clamp ring 150, as described above. Web members 146*a* can be integrally formed with second shield member 812 or attached to the second shield member. Web members 146*b*, on the other hand, are slightly spaced away from second shield member 814, generally sufficient to avoid rubbing contact with the second shield member during its movement. Further, the outer ends of web members 146*b* can be supported using a band 832 that is curved to match the curvature of second shield member 814 in a confronting relationship. Band 832 can extend from web members 146*a* that are immediately adjacent to second shield member 814. It should be appreciated that band 832 can be formed as a ring that extends around the entire inner periphery of first shield member 812.

Figure 18:
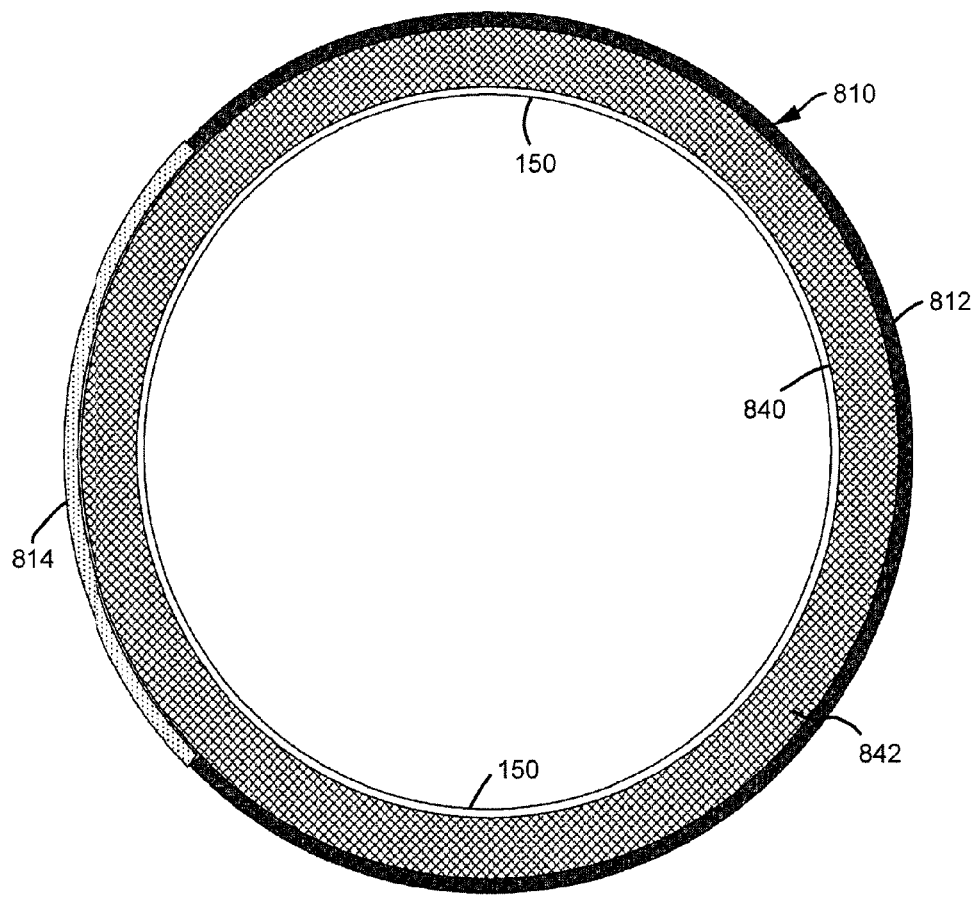
FIG. 18 is a diagrammatic plan view of the shield arrangement of FIG. 14, shown here to illustrate further details of another embodiment of a shield arrangement, in which web members are replaced by a grid.

Referring to FIG. 18, an isolated plan view of processing station 42 is shown including another embodiment of shield arrangement 810. Once again, the shield members are shown in the workpiece treatment mode, but circuitous path 830 has not been shown due to illustrative constraints, although it is understood to be present. In this embodiment, a grid 840 is used in place of web members 146. Grid 840 surrounds the periphery of the processing station and can be engaged at its inner periphery by clamp ring 150. The outer periphery of grid 840 can be attached in any suitable manner to first shield member 812. Grid 840, adjacent to second shield member 814, is slightly spaced away from the second shield member generally sufficient to avoid rubbing contact during its movement. Generally, the grid can be made rigid enough to maintain this non-contacting relationship. Suitable materials for use in forming grid 840 include, but are not limited to aluminum, titanium, and stainless steel. A representative aperture 842 that is defined by the grid can be approximately 4 mm in diameter, where a circular aperture is used. In one embodiment, the density of apertures in this HGC surface can be maximized to allow the highest gas conductance through this surface while retaining the required structural/mechanical and electrical integrity. The size, orientation and spacing of the apertures (or, in other embodiments, tabs and/or slots) can be designed so as to prevent, at least from a practical standpoint, penetration of plasma generating electric and magnetic fields, and to selectively pass neutral species while filtering charged species. Blocking the penetration of electric and magnetic fields impedes further ionization of gas constituents passing through this surface, thereby acting as a type of charged particle filter. Such an exemplary HGC surface can have significant thickness (such as a honeycomb structure where the height of the honeycomb structure is approximately the same as the distance across the openings of the honeycomb) so long as the HGC structure has high conductance.

It should be appreciated that grid 840 can be segmented such that a first segment is supported by the first shield member and clamp ring and a second segment is supported by and moves with second shield member 814. It is noted that grid 840 may be utilized essentially in conjunction with any shield arrangement described herein and may be used in conjunction with a baffle or web member configuration. Grounding considerations will be discussed immediately hereinafter with respect to shield members, web members, grid components and the like.

Figure 19:
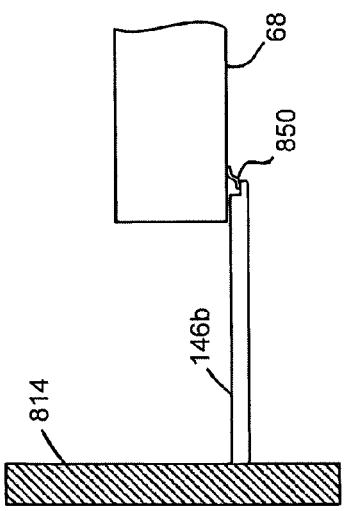

Referring to FIG. 19, one implementation of web member 146*b* is illustrated. In this example, the web member is fixedly attached to move with second shield member 814. A ground contact 850 is connected to ground shield 68 of the processing station. As illustrated, in the treatment position, web member 146*b* makes physical contact with contact 850 to serve in better grounding web member 146*b* and, thereby, second shield member 814. Contact 850 is flexible for purposes of ensuring contact with ground shield 68 in the treatment position and may be formed, like other such contacts described herein, from any suitable resilient material such as, for example, beryllium-copper alloys, copper based alloys and stainless steel alloys. These materials may be coated, for example, using aluminum, nickel, carbon or diamond like coatings (DLC).

Figure 20:
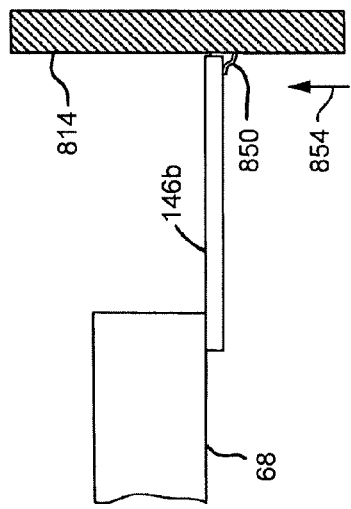
FIGS. 19 and 20 illustrate configurations for providing electrical contact between web and/or grid members, shield members and the ground shield of a processing station.

Referring to FIG. 20, another implementation of web member 146b is illustrated. In this example, the web member is fixedly attached to ground shield 68. It is noted that this may be accomplished using aforedescribed clamp ring 150. Accordingly, web member 146b is stationary in this example. A ground contact 852 is connected to second shield member 814 such that, when the second shield member moves from the workpiece transfer position in a direction indicated by an arrow 854, contact 852 physically contacts second shield member 146b to serve in better grounding web member 146b and, thereby, second shield member 814. Contact 852, like contact 850 is flexible for purposes of ensuring contact with ground shield 68 in the treatment position and may be formed from similar materials.

Figure 21B:
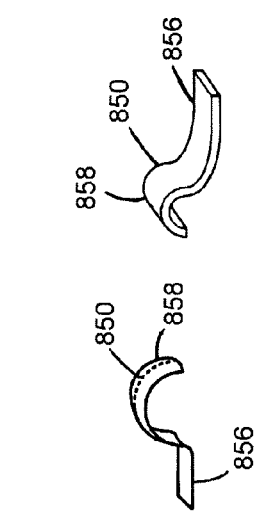
FIGS. 21a and 21b are diagrammatic perspective views that illustrate embodiments of a resilient contact that can be used for grounding purposes in a shield arrangement of the present disclosure.
Figure 21A:
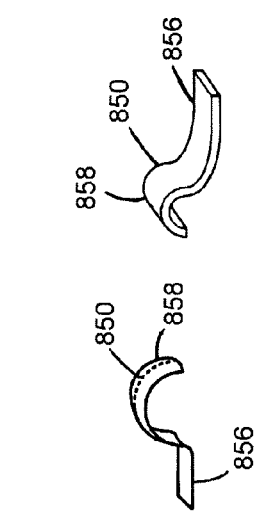

FIGS. 21a and 21b illustrate suitable forms of contact 850, in further enlarged views, wherein each contact includes an attachment portion 856 and a contact portion 858. Attachment portion 856 may be fixedly attached to a supporting component, for example, by welding.

Figure 22B:
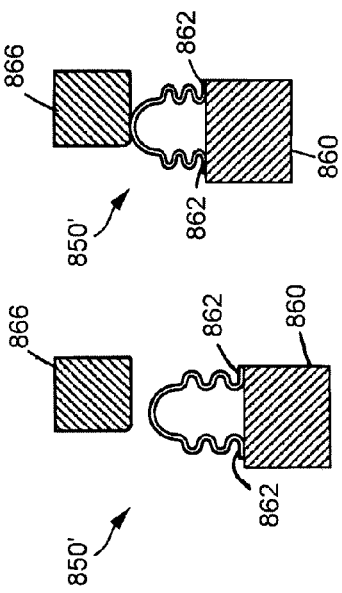
FIGS. 22a and 22b are diagrammatic views, in elevation, that illustrate the structure of a compressible contact that can be used for grounding purposes in a shield arrangement of the present disclosure.
Figure 22A:
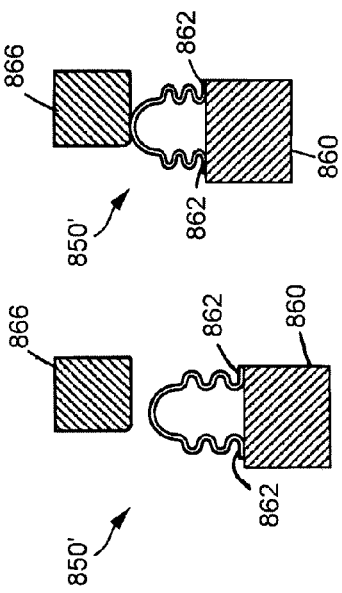

FIGS. 22a and 22b illustrate another contact 850' that is supported by a first chamber component 860. Feet 862 are attached to first chamber component 860. The sidewalls of contact 850' include a compressible serpentine configuration such that contact with a second chamber component 866 results in capturing contact 850' between the two chamber components that can form an electrical grounding contact therebetween.

Figure 23:
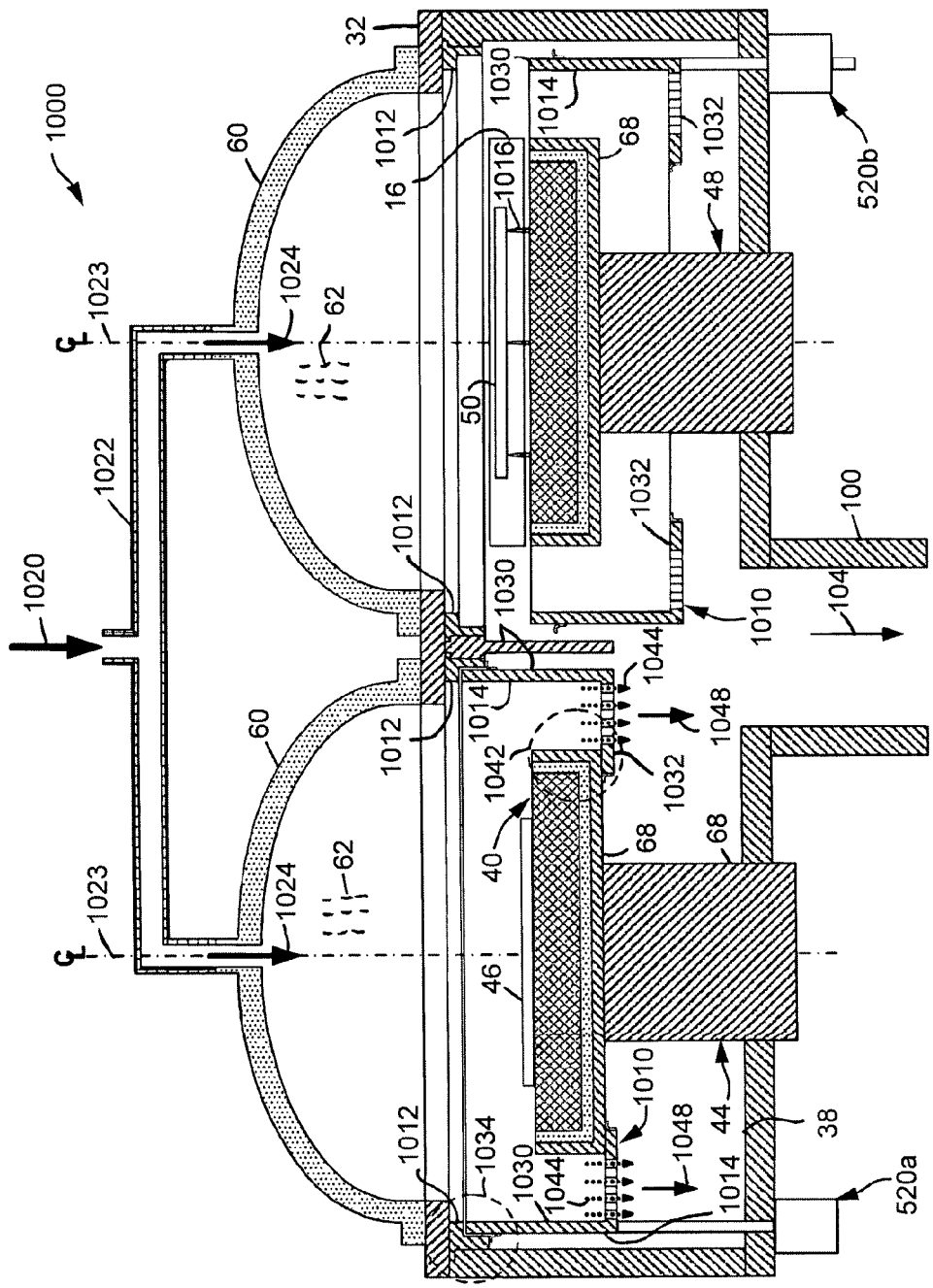
FIG. 23 is a diagrammatic partially cut-away illustration, in elevation, of another embodiment of a processing system including a shield arrangement according to the present disclosure.

Attention is now directed to FIG. 23 which illustrates another embodiment of a processing chamber arrangement, generally indicated by the reference number 1000. FIG. 23 shows processing chamber arrangement 1000 in a diagrammatic, cutaway elevational view with the back of the chamber and lid removed and looking toward the front of the chamber where slit door 16 is located. Processing chamber arrangement 1000 includes a number of components previously described above. Accordingly, descriptions of these like components may not be repeated for purposes of brevity. Further, processing chamber arrangement 1000 shares the benefits that are provided by the processing chamber arrangements, as described above and may provide still further benefits. The present embodiment includes a shield arrangement 1010 that is made up of a first shield member 1012 and a second shield member 1014. For illustrative purposes, the shield arrangement on the left side of the figure, for processing station 40, is shown in a workpiece treatment mode, whereas the shield arrangement on the right side of the figure, for processing station 42, is shown in the workpiece transfer mode such that workpiece transfer slit 16 is visible. It is understood that, while showing the processing stations in different modes in the various figures serves as an expedient in the context of these descriptions, both processing stations are normally operated in the same mode for purposes of workpiece transfer and treatment. Workpiece 50 is supported on lift pins 1016, for example, awaiting transfer out of the processing chamber. Each first shield member 1012 surrounds the opening leading to one of plasma sources 60. An input gas mixture 1020 is fed to gas piping 1022 which introduces substantially equal amounts of plasma feed gas along a centerline 1023 to each of the plasma sources during the treatment mode, as indicated by arrows 1024. Second shield member 1014 is supported for movement vertically in the view of the figure, for example, using actuator arrangements 520a and 520b, as described above. Second shield member 1014 includes a peripheral sidewall 1030 that can be cylindrical in configuration and a projecting member 1032, that can be annular-shaped, which extends inward from the lower periphery of sidewall 1030. Peripheral sidewall 1030 and projecting member 1032 can be integrally formed or formed separately and then attached to one another. It should be appreciated that projecting member 1032 can be configured to function in the manner of a baffle, as described above, for purposes of equalizing flow around the periphery of each pedestal. For example, the projecting member can define a distribution of apertures as shown in FIG. 8b.

Figure 24B:
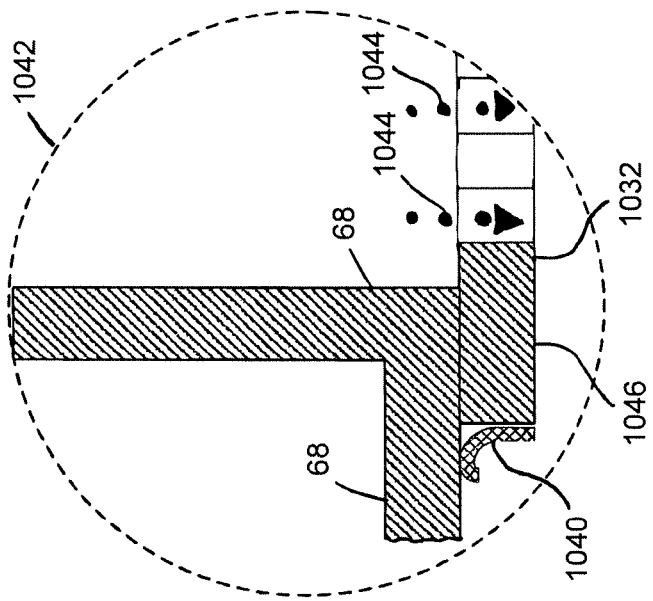
FIGS. 24a and 24b are diagrammatic cut-away views, in elevation, which illustrate details of the structure of the shield arrangement shown in FIG. 23.
Figure 24A:
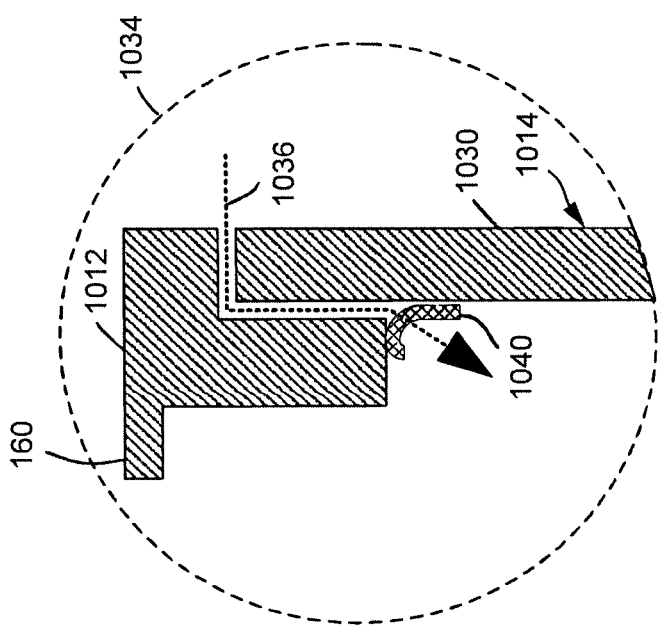

Referring to FIG. 24a in conjunction with FIG. 23, the former figure is a further enlarged view that illustrates the relationship between first shield member 1012 and second shield member 1014 within a dashed circle 1034 that is seen in FIG. 23 in the treatment mode. First shield member 1012 can be captured between chamber body 30 and chamber lid 32, for example, as described above using flange 160 (see also, for example, FIGS. 4 and 6a) to electrically connect and thereby ground the first shield member to chamber lid 32. The shield members cooperate to define a circuitous path 1036 for any particles that attempt to exit from the shield arrangement via this route. Accordingly, charged species are effectively blocked. Electrical connection and thereby grounding of second shield member 1014 to first shield member 1012 can be assured, at least in part, by using a plurality of grounding contacts 1040 which resemble those described, for example, with respect to FIGS. 19, 20, 21a and 21b, and can be formed using similar materials.

Referring to FIG. 24b in conjunction with FIG. 23, the former figure is a further enlarged view that illustrates the relationship between projecting member 1032 of the second shield member and ground shield 68 in the treatment mode within a dashed circle 1042 that is seen in FIG. 23. Grounding of second shield member 1014 to ground shield 68 can be assured, at least in part, by using additional grounding contacts 1040 which can be attached to projecting member 1032. A flow of neutral species 1044 is illustrated by dotted lines. As best seen in FIG. 24a, the neutral species can pass, for example, through apertures that are defined by projecting member 1032. It is noted that an interior ring 1046 of the projecting member can be solid, for example, as a strength enhancement feature.

Turning again to FIG. 23, in the treatment mode, peripheral sidewall 1030 of second shield member 1014 surrounds a respective one of the workpieces undergoing treatment. First shield member 1012 cooperates with peripheral sidewall 1014 of the second shield member to form the LGC portion of the shield arrangement as part of an overall selectively transparent shield. The HGC portion of the selectively transparent shield is formed by projecting member 1032 and can include any suitable expedient for purposes of limiting the passage of charged species while facilitating the flow of neutral species, either described above or yet to be described. Combined flow of neutral species through the HGC portion is represented by a pair of arrows 1048 responsive to exhaust flow 104.

Figure 25:
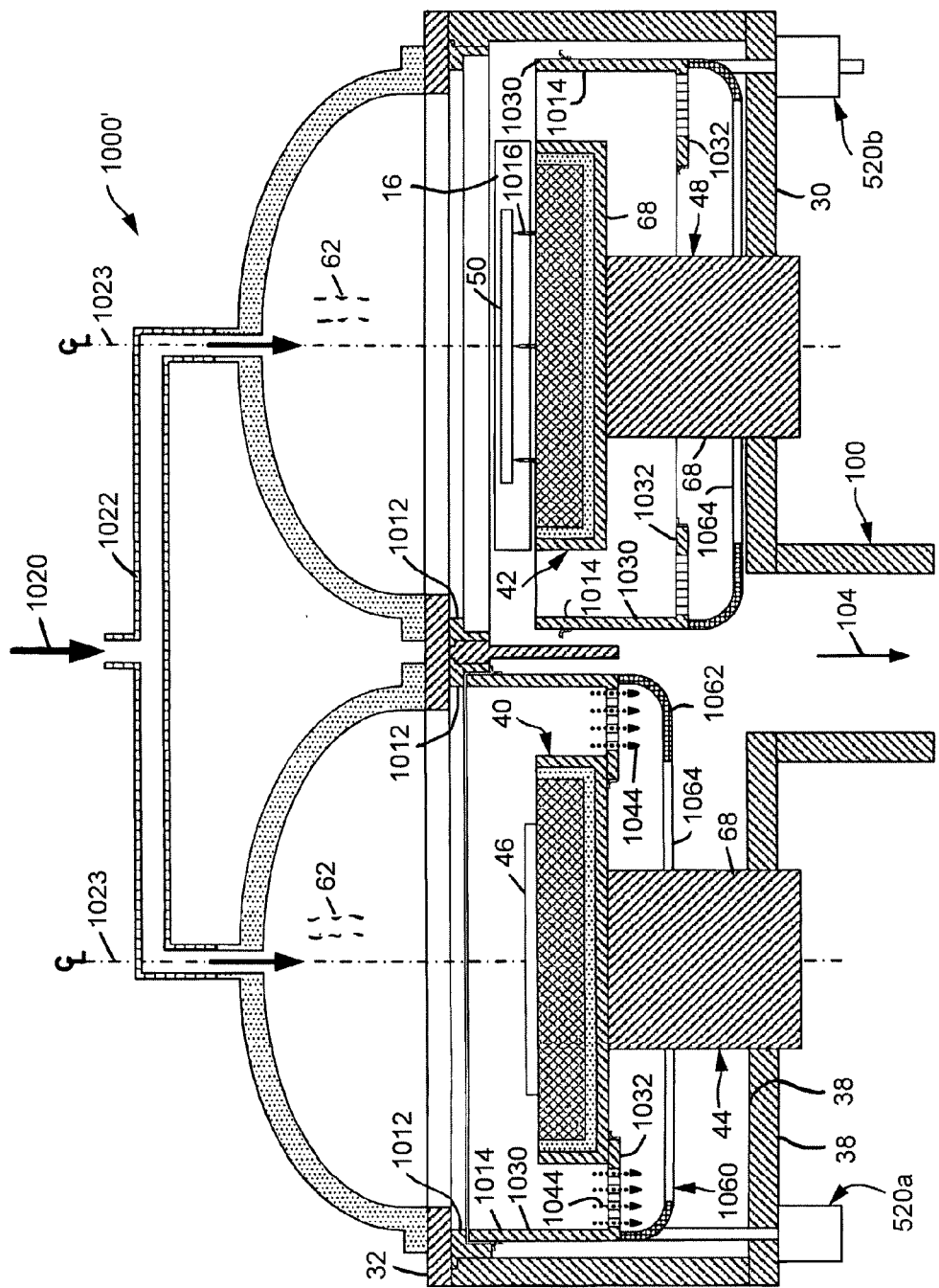
FIG. 25 is a diagrammatic partially cut-away illustration, in elevation, of still another embodiment of a processing system including a shield arrangement according to the present disclosure, including a baffle member.

Turning to FIG. 25, a modified form of the processing chamber arrangement of FIG. 23 is generally indicated by the reference number 1000'. Accordingly, descriptions of like components will not be repeated for purposes of brevity. In the present example, a baffle member 1060 is provided in addition to projecting member 1032 and moves with each second shield member 1014. The baffle member can be integrally formed as part of the second shield member or separately formed and attached in a suitable manner. The baffle member can include any suitable configuration for controlling flow around a respective pedestal, for example, as described above. In the present example, a hatched portion 1062 of each baffle member 1060 comprises a solid wall as part of the LGC portion, whereas an unhatched portion 1064 of each baffle member is configured for affecting the flow about the periphery of the pedestal.

Figure 26:
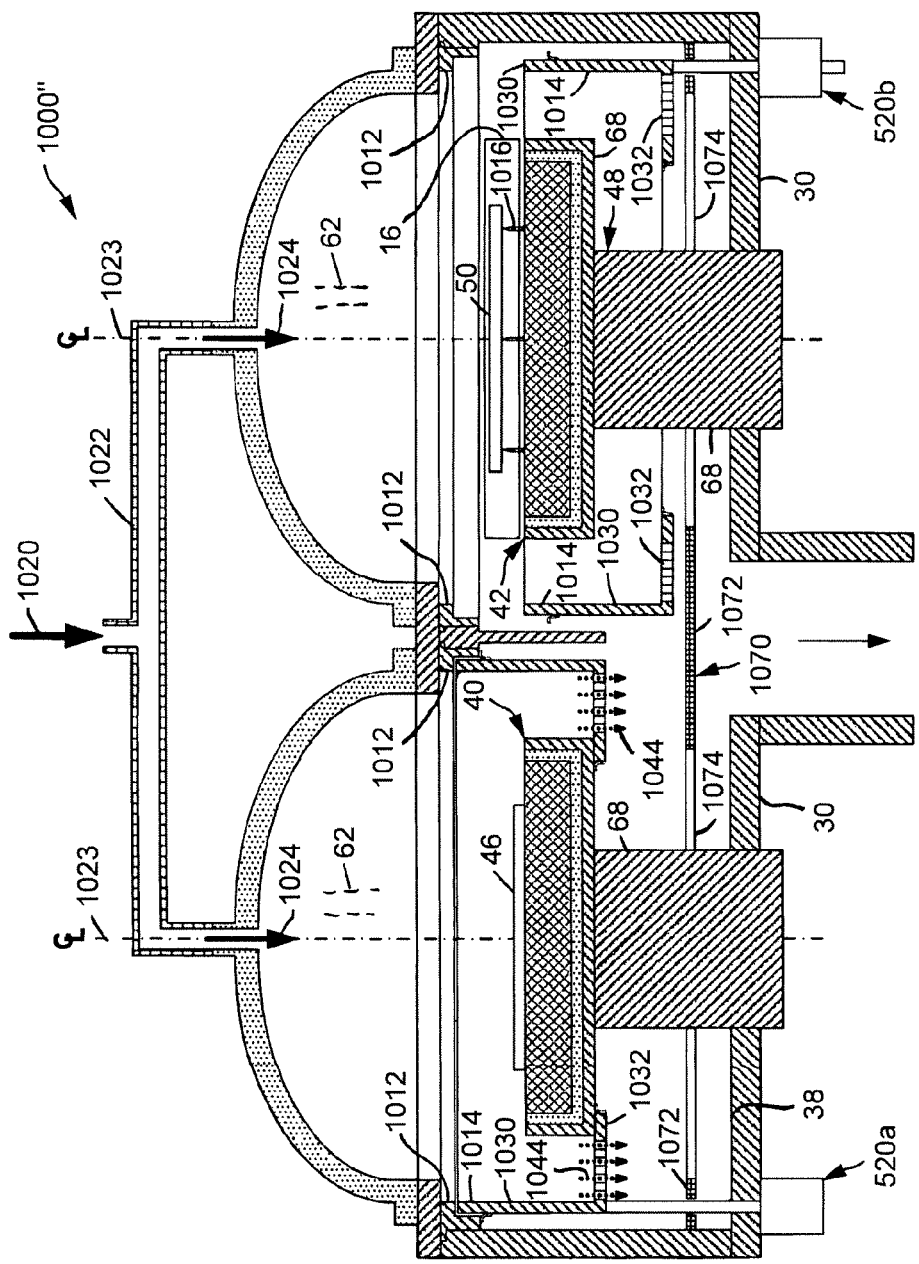
FIG. 26 is a diagrammatic partially cut-away illustration, in elevation, of yet another embodiment of a processing system including a shield arrangement according to the present disclosure, including a baffle panel in the lower extents of the processing chamber.

Turning to FIG. 26, another modified form of the processing chamber arrangement of FIG. 23 is generally indicated by the reference number 1000″. Accordingly, descriptions of like components will not be repeated for purposes of brevity. In the present example, a baffle panel 1070 is provided generally across the bottom of chamber 30. The baffle panel can be selectively removable from the chamber in order to facilitate cleaning. The baffle panel can include any suitable configuration for controlling flow around a respective pedestal, for example, as described above. In the present example, a hatched portion 1072 of the baffle panel comprises a solid wall as part of the LGC portion that blocks all flow, whereas an unhatched portion 1074 of the baffle panel is configured for controlling the flow about the periphery of each pedestal.

It should be noted that in all of the embodiments described up to this point of the disclosure the peripheral sidewall of the shield arrangement makes up a portion of the LGC portion of the STS whereas the opening at the bottom of the shield arrangement, opposing the treatment source, is used to make up the HGC portion of the STS. As will be seen below, the HGC and LGC portions can be positioned with a considerable degree of flexibility.

Figure 27:
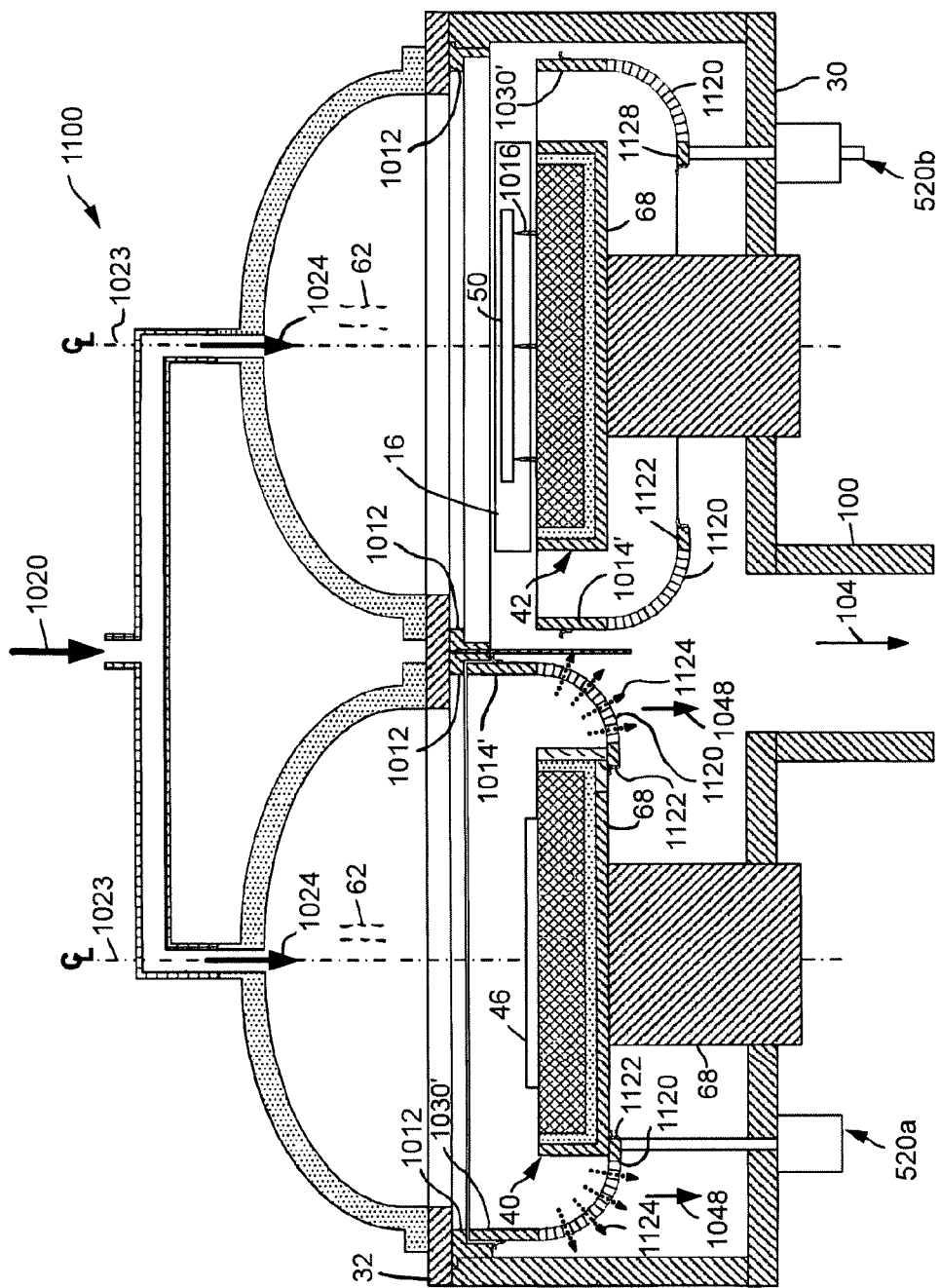
FIG. 27 is a diagrammatic partially cut-away illustration, in elevation, of a continuing embodiment of a processing system including a shield arrangement according to the present disclosure, including a shield member having a curved or toroidal wall section.

Attention is now directed to FIG. 27 which illustrates another embodiment of a processing system that is generally indicated by the reference number 1100 and represents a modified form of system 1000 of FIGS. 23, 24a and 24b. Accordingly, the present discussion will be limited to components that have been changed in some manner. In particular, second shield member 1014' includes peripheral sidewall 1030' that can be somewhat shorter in height as compared to peripheral sidewall 1030 of FIG. 23. Peripheral sidewall 1030' forms a portion of the LGC portion of the selectively transparent shield. Further, the HGC portion of the selectively transparent shield is formed by a curved wall section 1120 that continues downward from peripheral sidewall 1030' and transitions through a bend so that a ring-like edge 1122 confronts ground shield 68 in essentially the same manner as projecting member 1032 of FIG. 23. In the present example, flows 1124 of neutral species are facilitated in the treatment mode responsive to exhaust flow 104. Curved wall section 1120 can be configured in any suitable manner for purposes of limiting passage of charged species while permitting the flow of neutral species, for example, using a grid such as is described above or using non-line-of-sight configurations described herein. In one embodiment, curved wall section 1120 can define a plurality of spaced apart apertures with ring-like edge 1122 being solid.

Figure 28:
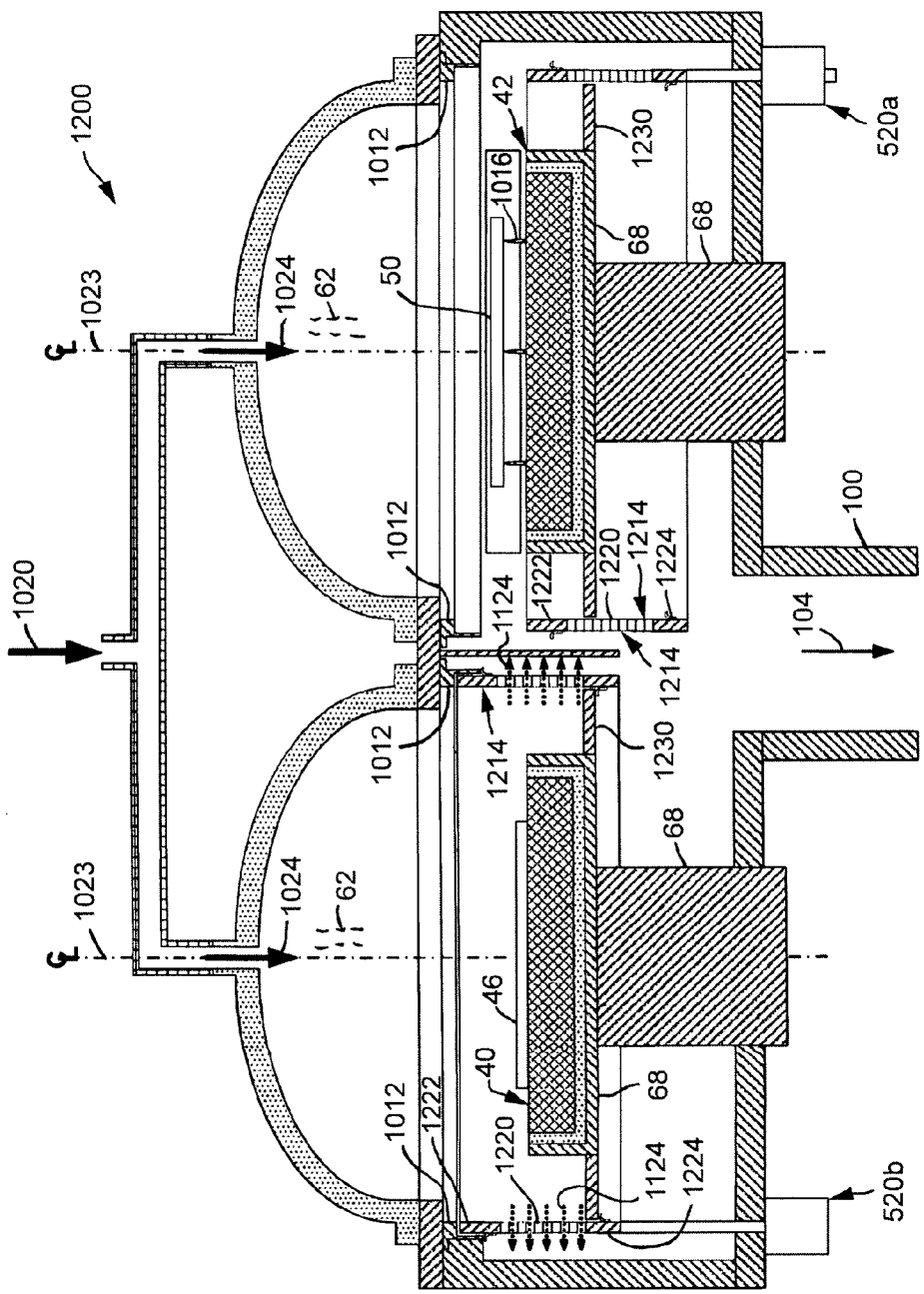
FIG. 28 is a diagrammatic partially cut-away illustration, in elevation, of a further embodiment of a processing system including a shield arrangement according to the present disclosure, including a shield member using a radial exhaust flow configuration.

FIG. 28 illustrates another embodiment of a processing system that is generally indicated by the reference number 1200 and represents a modified form of system 1100 of FIG. 27. Accordingly, the present discussion will be limited to components that have been changed in some manner. In particular, a second shield member 1214 includes a peripheral sidewall that forms portions of both the HGC and LGC portions. In the present example, a central band 1220 of the second shield member, with normal hatching, provides flows 1124 of neutral species in the treatment mode responsive to exhaust flow 104. The central band is positioned between an upper band 1222 and a lower band 1224, each of which can block all flow as part of the LGC portion. Flows 1124 emanate at least generally radially from each second shield member 1214 and then become part of exhaust flow 104. Central band 1220 can include any suitable configuration for facilitating the flow of neutral species while blocking charged species including, for example, non-line-of-sight configurations. A peripheral skirt 1230 can be attached to ground shield 68 of each pedestal to form part of the LGC portion of the shield arrangement.

Having described a number of embodiments of the shield arrangement of the present disclosure above, it is worthwhile to point out that each of these shield arrangement embodiments accommodates the arrival and departure of workpieces along a radial arcuate path. Accordingly, the shield arrangement is well suited for use as part of the systems described in the above incorporated '582 and '412 applications. Further, a great deal of flexibility is provided with respect to other configurations of workpiece transfer paths. That is, virtually any transfer path can be accommodated. It is noted that the embodiments described above facilitate ease of component replacement as required for maintaining the ever increasing demanding level of process consistency required by leading semiconductor device manufacturers.

The shield arrangement of the present disclosure with HGC and LGC portions, in the treatment mode, provides a number of advantages relating at least to process uniformity, repeatability and lower maintenance, resulting in higher process performance with greater predictability and lower cost of ownership in high volume manufacturing applications. These benefits will be addressed immediately hereinafter in some detail.

The various segments or members of each shield arrangement cooperate in the treatment mode so as to provide an axisymmetric or near axisymmetric ground surface (around an axis of symmetry of the workpiece pedestal of each processing station), having a low impedance electrically grounded surface extending from the periphery of the grounded surface of the workpiece pedestal to the lid of the processing chamber.

In the treatment mode, each shield arrangement provides a relatively large grounded area around the volume containing the plasma adjacent to each workpiece. Each processing station is equipped with a plasma source to provide the reactive species required to drive the process at each processing station within a common, shared processing chamber. Each processing station may be equipped with an identical configuration for creating and sustaining a plasma. The large grounded area of the shield arrangement results in decreased sputtering of all grounded areas (especially when some of the power is coupled into the plasma capacitively, such as by RF power to the workpiece or an electrode), thereby lowering workpiece contamination and thereby yielding improved process performance. The grounded surface area, immediately adjacent to the plasma, lowers the electrical inductance between the plasma and ground, thus supporting the return of RF bias currents that pass through the plasma to all grounded surfaces adjacent to the plasma, and helps to prevent inductive ground voltages that can cause arcing to grounded surfaces which might otherwise occur if the inductance is high. The grounded shield arrangement reduces magnetic coupling between the bias currents of adjacent processing stations and thereby greatly reduces or eliminates the non-uniformity and non-repeatability that such coupling can induce. In and by itself, the shield arrangement reduces EMI (electromagnetic interference) emissions to system control circuitry, which can negatively impact overall system control, repeatability and system uptime performance. Although not a requirement, the use of multipoint RF ground contacts as seen, for example, in FIGS. 19, 20, 21a, 21b, 22a and 22b, can effectively still further widen the ground path (between adjacent processing stations), and can further lower the ground return impedance and also further reduce magnetic coupling between process regions. The multiple contact points can also decrease the magnitude of nonsymmetrical harmonics of the bias current flowing in the skin layer of the plasma adjacent to the return current paths in the shield arrangement, further improving axisymmetry of plasma heating and thus process uniformity.

The various segments or members of each shield arrangement cooperate in the treatment mode so as to provide a near axisymmetric pressure distribution and gas flow around the periphery of each processing station within a common processing chamber. This axisymmetric pressure distribution results in the axisymmetric mass transport of the process gas constituents (gas flow) at the periphery of each workpiece pedestal. The axisymmetric pressure distribution and gas flow cooperate so as to insure the realization of high azimuthal process uniformity and process equivalence at each processing station within a common processing chamber. The shield arrangement effectively acts as a selectively transparent shield, which passes neutral particles while generally filtering out charged particles, light, electric, and magnetic fields. The result is demonstrated in what are believed to be heretofore unachievable levels of processing symmetry and electromagnetic shielding in a batch processing environment.

With respect to photon transfer between processing stations, the various segments or members of each shield arrangement cooperate to effectively prevent such an exchange of photons between processing stations. The shield arrangement generally prevents direct transmission of light between processing volumes since light travels along straight paths in the absence of reflections. Indirect transmission is also negligible because the probability that light which is incident upon surfaces outside the shield arrangement will reflect through a shield arrangement and into the other processing volume is low, since there is a much larger probability of reflection in harmless directions or absorption by a surface. By limiting or preventing, at least from a practical standpoint, the passage of light between adjacent processing stations, the ability is provided to independently monitor, control and terminate the process endpoint at each processing station within a common processing chamber. In this regard, it is most often the case during batch processing that there are some differences in the starting material to be processed on each workpiece or some other starting condition difference that would lead to different process results from one workpiece to the next. Accordingly, workpiece to workpiece process results for a given batch can be made more consistent through independent termination of the process for each processing station based, for example, on a process endpoint indication. Stated in a slightly different way, the processing time can be customized for each workpiece to achieve a targeted endpoint of the process. Independent monitoring and control of the process at each processing station allows for manual or automatic verification of the predicted/expected process performance prior to the start of processing, at the start of processing, during processing and independent termination of process as required to maintain the highest level of process performance.

As described above, any circuitous paths formed as part of the LGC portion of each shield arrangement allows neutral gas constituents from the process ambient of one processing station to mix with the process ambient of any adjacent processing station within a shared processing chamber. This has the effect of passively equalizing the realized process pressure (condition) at each workpiece in each processing station within the shared processing chamber.

It is recognized that, if ions from one processing station are allowed to enter the processing region of any adjacent processing station, the ions can negatively influence the process uniformity of the workpiece in the process ambient upon which they intrude. The shield arrangement is selectively transparent to the extent that it prevents the passage of charged particles (both ions and electrons) from the process ambient of one processing station to the process ambient of any adjacent processing station within the shared processing chamber while simultaneously allowing for the exchange of neutral gas constituents between adjacent processing stations within the shared processing chamber.

In view of the foregoing, charged species are generally contained and do not exit the principal process region in which they are produced. Therefore, the consistency and repeatability of the energy delivered to each processing region is improved, resulting in improved process control at each processing station and overall process repeatability, uniformity and consistency run-to-run and station-to-station. Limiting the charged species that exit the principal process region at each processing station has the additional benefit of reducing the opportunity for deposition of gaseous process constituents on surfaces outside of the processing volume, thereby reducing the effect of deposition accumulation outside of the shield arrangements and the time required to remove this accumulation and/or service intervention steps to replace coated or affected surfaces. Commercial benefits are attendant to reducing time required for activities that do not directly result in processing of workpieces. That is, reduction of maintenance time translates to higher tool productivity and lower cost of ownership.

At this juncture, it is worthwhile to provide some additional level of detail with respect to the HGC portion of each shield arrangement. Because of the internal surface configuration of the HGC portion, it acts directly as a filter for those charged particles that impact its surfaces. For example, ions can acquire (or combine with) an electron and be transformed into a neutral constituent gas species. In this regard, the local (ambipolar and sheath) electric fields usually attract positive ions to the surface of the HGC portion. As another example, electrons can impact the surface and be removed as return current. At the same time, the local electric fields tend to cause passing charged particles to impact the HGC surfaces. Increasing the thickness (i.e., in the direction of particle travel) of the HGC portion can correspondingly increase the effectiveness of the HGC as a filter to restrict the passage of charged particles, as does decreasing the size of the defined apertures or openings.

The HGC portion is designed to block the passage of both electric and magnetic fields thereby impeding ionization of exiting gas constituents on the downstream side of the HGC surface. By impeding ionization, the formation of charged species such as ions and electrons is avoided.

The HGC portion also acts directly as an optical filter to reduce the amount of light that passes therethrough. In general, the openings in the HGC portion can be designed such that there is no line of sight path between the processing regions, so that photons need to reflect multiple times to travel between processing regions, making insignificant the optical coupling between regions. Certain embodiments may use one or more additional surfaces to assure adequate blockage of light that can be reflected through some particular path in the shield, between adjacent processing stations.

Like the LGC portion, the HGC portion of each shield arrangement is a selective shield as it does allows passage of neutral gaseous constituents from the process ambient to pass through numerous openings in the HGC surface. The HGC portion facilitates a majority of the passive pressure equalization between processing regions.

In several of the embodiments described in detail above, the gas conductance below the HGC portion (having an overall annular shape), in the absence of any other intervening provisions, is non-symmetrical. To insure that a desired axisymmetrical pressure distribution at the periphery of each workpiece pedestal is obtained, the gas conductance through the HGC portion can be adjusted/tuned so as to result in establishing a uniform average flow of gas around the periphery of the workpiece pedestal assembly in the treatment mode.

In another embodiment, the HGC portion (having an overall annular shape) may be fabricated with a uniform radial gas conductance and a corrected flow balance can be achieved by the addition of an additional surface below the HGC portion that corrects for the non-symmetrical gas conductance below the HGC portion where this non-symmetrical gas conductance is a result of offset of the exhaust arrangement. Such an additional surface can be designed so that distance to the HGC portion is adjustable, thereby allowing for adjustable flow balance corrections that correct for differences in process recipe parameters such as process gas-molecular-weight, temperature, pressure and flow rates.

In another embodiment, the HGC portion (having an overall annular shape) may be fabricated with a uniform radial gas conductance, the non-symmetrical gas conductance below the HGC portion may be corrected by the addition of a fixed baffle below the HGC portion that creates conditions such that the gas conductance through the HGC portion (and therefore around the pedestal) is approximately equal around the periphery of the annular HGC portion over the expected range of process pressure and gas flow conditions.

The HGC portion may be equipped with various features (such as coils and/or channels for cooling and/or heating using heat exchange liquids or gases) to allow the HGC portion to be maintained at a desired temperature. In other embodiments, the HGC portion can be cooled by thermal conduction to the LGC portion and the workpiece pedestal. Temperature control can be of benefit for the reasons discussed above.

Attention is now directed to FIGS. 29a-c, which are partially cut-away views, in cross-sectional elevation, which diagrammatically illustrate a number of suitable embodiments of an HGC structure for use in any of the aforedescribed HGC portions of a shield arrangement. FIG. 29a illustrates a double wall HGC structure, generally indicated by the reference number 1300. A first wall 1302 defines a first plurality of apertures 1304 having a given orientation. A second wall 1306 is positioned in a confronting, spaced apart relationship with first wall 1302 and defines a second plurality of apertures 1308. The latter apertures can be oriented orthogonally with respect to the given orientation of first apertures 1304. The first and second walls are of a sufficient thickness, in cooperation with the angular orientation of the apertures, such that there is no line of sight path through the apertures of the structure. For example, ions 1310a and 1310b are illustrated on respect paths of travel which would cause the ions to impact an internal surface of the HGC structure. As a result of the collision, the ion may combine with an electron 1312 to form a neutral species. A neutral species 1314, on the other hand, is shown traveling through the HGC structure. It should be appreciated that the spaced apart relationship between first wall 1302 and second wall 1306 that is shown is not required: The walls can be attached to one another. Further, a single wall may be formed, for example, having cooperating apertures formed inward from both major surfaces of the wall.

Referring to FIG. 29b, another embodiment of a double wall HGC structure is generally indicated by the reference number 1320. First wall 1302 defines a first plurality of apertures 1322 in a direction that can be normal to the plane of wall 1304. Second wall 1306 is again positioned in a confronting, spaced apart relationship with first wall 1302 and defines a second plurality of apertures 1324. The latter apertures can also be normal to the plane of wall 1306. In this embodiment, however, first apertures 1322 and second apertures 1324 are laterally offset with respect to one another such that there is no line of sight path through the apertures of the structure. For example, ion 1330 is illustrated on a path of through one of apertures 1322, but it will travel so as to collide with an internal surface of the HGC structure. As a result of the collision, ion 1330 may combine with an electron 1332 to form a neutral species. A neutral species 1334, on the other hand, is shown as it travels through the HGC structure.

Referring to FIG. 29c, still another embodiment of an HGC structure is generally indicated by the reference number 1340. Embodiment 1340 resembles embodiment 1300 of FIG. 29a except that apertures 1304 and 1308 are defined in a single wall thickness 1342 so as to meet in a chevron pattern. It should be appreciated that the present examples of HGC structures are not intended as being limiting and a wide variety of modifications is possible in view of this overall disclosure.

The shield arrangement of the present disclosure serves to mimic a single wafer processing environment in a batch processing environment, at least from the viewpoint of charged species, to produce an enhanced level of uniformity that is believed to be unsurpassed in a batch processing chamber. Moreover, the batch processing chamber is configured for high throughput using a slit valve such that the chamber can be interfaced with a high production transfer chamber such as is described in the above incorporated '582 and '412 applications. In this regard, non-uniformities of process results due to the presence of the slit valve have been all but eliminated. Applicants have brought to light a solution which essentially resolves the problem of asymmetrically disposed surfaces in a batch processing system, irrespective of the reason for the asymmetric distribution of these surfaces, for example, as a result of being part of a high speed wafer transport system (i.e., slit valves) or as a result of batch processing stations sharing a common chamber interior. In this regard, there would even be a benefit with respect to using an orthorectangular shaped chamber interior with circular shaped workpieces when a processing station is situated at the center of the chamber interior, since the surface arrangement of the sidewalls of such a chamber are necessarily disposed at a varying distance from the peripheral edge of the workpiece. Essentially, the effect of the shape of the chamber interior has been eliminated by the shield arrangement of the present disclosure to provide a great deal of flexibility in this regard, even for future designs, while still providing for efficient transfer of workpieces in a high throughput system configuration. Further, because of the provision of station-to-station pressure equalization, systems including the shield arrangement of the present disclosure are believed to provide the best workpiece-to-workpiece uniformity of which Applicants are aware in a batch processing environment. The net result of all of these benefits is reduced system cost while maintaining high throughput and remarkable levels of process uniformity. Insofar as applicants are aware, these benefits have never been realized in a batch processing system.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An apparatus for processing workpieces in a treatment process, said apparatus comprising:
a multi-wafer chamber defining a chamber interior including at least two processing stations within the chamber interior such that the processing stations share the chamber interior, each of which processing stations includes a plasma source and a workpiece pedestal, and each of which processing stations is configured for exposing one of the workpieces to the treatment process using a respective plasma source, and the chamber isolates a treatment pressure in the chamber interior from an ambient pressure outside the chamber, said chamber including an arrangement of one or more electrically conductive surfaces that are asymmetrically disposed about the workpiece at each processing station in a way which produces a given level of uniformity of the treatment process on a major surface of each workpiece; and
an electrically conductive shield arrangement, located in said chamber interior, for each of the processing stations with each electrically conductive shield arrangement selectively operable (i) in a first, workpiece transfer mode to provide for transferring each workpiece to and from the workpiece pedestal of one of the processing stations and (ii) in a second, treatment mode to surround each workpiece, located on the workpiece pedestal of one of the processing stations, such that the treatment mode provides an enhanced uniformity of exposure of the workpiece to the respective one of the plasma sources that is greater than the given level of uniformity that would be provided in an absence of the shield arrangement.

2. The apparatus of claim 1 wherein one or more gaseous species are introduced into each shield arrangement for each of said plasma sources and wherein each shield arrangement in said treatment mode provides for an exchange of said gaseous species through that shield arrangement resulting in an equalization of a treatment pressure experienced by each workpiece within the processing chamber.

3. The apparatus of claim 1 wherein said arrangement of one or more electrically conductive surfaces that are asymmetrically disposed about the workpiece produces a given uniformity of residence time for any gaseous species that are introduced into each shield arrangement for each of said plasma sources and said shield arrangement, in said treatment mode, provides an enhanced uniformity of residence time for the gaseous species that are introduced into each shield arrangement that is greater than the given uniformity of the residence time.

4. The apparatus of claim 1 wherein each workpiece includes a circular peripheral outline and wherein each shield arrangement for each processing station in the treatment mode introduces a generally cylindrical plasma volume at least between the workpiece at that processing station and the plasma source of that processing station while maintaining a pressure equalization between the generally cylindrical plasma volume from one processing station to the next, irrespective of said asymmetrical wall arrangement.

5. The apparatus of claim 1, further comprising:
an actuator arrangement for actuating the shield arrangement at each of the processing stations between the wafer transfer mode and the treatment mode.

6. The apparatus of claim 5 wherein said actuator arrangement is configured for actuating the shield arrangement of each of the processing stations in unison.

7. The apparatus of claim 1 wherein said shield arrangement includes a first annular shield member surrounding the workpiece in a stationary position and a second shield member that is supported for movement between a first position and a second position in which first position the second shield member cooperates with the first shield member for operation of the shield arrangement in said wafer transfer mode, and in which second position, the second shield member cooperates with the first shield member for operation of the shield arrangement in the treatment mode.

8. The apparatus of claim 7 wherein said first annular shield member defines a slot for moving the workpiece through the slot in said wafer transfer mode to and from the workpiece pedestal.

9. The apparatus of claim 8 wherein said first annular shield member includes a cylindrical peripheral outline and said second shield member includes a shield surface confronting the cylindrical peripheral outline of the first annular shield member such that for any given location on the shield surface of the second shield member, in said second position, a projected distance to the cylindrical outline of the first annular shield member, which projected distance extends in a surface normal direction with respect to the cylindrical outline, is at least approximately constant.

10. The apparatus of claim 9 wherein said second shield member includes a shield member peripheral outline such that a projection of the shield member peripheral outline, in said surface normal direction and with the second shield member in said second position, falls onto the cylindrical peripheral outline of the first annular shield member and surrounds the slot in a spaced apart relationship to form a margin around the slot so that the second shield member serves as a shutter.

11. The apparatus of claim 10 wherein said first annular shield member includes an axis of symmetry and defines an additional slot that is symmetrically opposed to the first mentioned slot and the apparatus further includes an additional shutter in a confronting relationship with said additional slot to at least mimic a relationship between the first mentioned slot and the second shield member such that the additional slot and the additional shutter cooperate to provide an enhanced uniformity of said treatment process across said workpiece at least in directions that extend between said first mentioned slot and the additional slot.

12. The apparatus of claim 11 wherein the additional shutter and additional slot are symmetrically formed as a mirror image of the first mentioned slot and shutter such that any radial nonuniformity that is introduced by the first mentioned slot is azimuthally matched by the additional slot.

13. The apparatus of claim 12 wherein said additional shutter is positionally fixed on the first shield member with respect to the additional slot to match the position of the first mentioned shutter in the treatment mode.

14. The apparatus of claim 7 wherein said second shield member includes an annular configuration.

15. The apparatus of claim 14 wherein said first annular shield member includes an axis of symmetry and defines an additional slot that is symmetrically opposed to the first mentioned slot such that the second shield member confronts the first mentioned slot and the additional slot in said second position.

16. The apparatus of claim 15 wherein the additional slot is symmetrically formed as a mirror image of the first mentioned slot such that any radial nonuniformity that is introduced by the first mentioned slot is azimuthally matched by the additional slot.

17. The apparatus of claim 7 wherein said second shield member defines an axis of symmetry and said second shield member moves in a direction along said axis of symmetry between the first position and the second position.

18. The apparatus of claim 7 wherein, for any given position of the second shield member, a non-contacting relationship is maintained between the first shield member and the second shield member to limit generation of particles and a spaced apart non-contacting relationship is maintained between the first and second shield members and the asymmetrically disposed arrangement of electrically conductive surfaces of the chamber.

19. The apparatus of claim 7 wherein said workpiece includes a workpiece diameter and wherein said first shield member includes a first cylindrical outline having a first diameter and the second shield member includes a second cylindrical outline having a second diameter such that the workpiece diameter is less than the first diameter and the second diameter.

20. The apparatus of claim 19 wherein the first diameter of the first shield member is greater than the second diameter of the second shield member such that the second shield member is positioned within the first diameter of the first shield member and the first shield member is in a spaced apart non-contacting relationship from the asymmetrically disposed arrangement of electrically conductive surfaces of the chamber such that said treatment mode provides for an exchange of gaseous species through the shield arrangements resulting in an equalization of a treatment pressure experienced by each workpiece within the processing chamber.

21. The apparatus of claim 19 wherein the first diameter of the first shield member is less than the second diameter of the second shield member such that the first shield member is positioned within the second diameter of the second shield member and the second shield member is in a spaced apart non-contacting relationship from the asymmetrically disposed arrangement of electrically conductive surfaces of the chamber such that said treatment mode provides for an exchange of gaseous species through the shield arrangements resulting in an equalization of a treatment pressure experienced by each workpiece within the processing chamber.

22. The apparatus of claim 7 wherein said multi-wafer chamber includes a chamber body and a chamber lid that is selectively engagable with the chamber body for defining said chamber interior and wherein each first annular shield member includes a cylindrical body having a first end that opens towards an associated one of said plasma sources and a second end that opens at least generally towards an exhaust port of the chamber workpieces and said first end includes an outwardly projecting peripheral flange that is captured between the chamber lid and the chamber body when the first annular shield member is in an installed configuration.

23. The apparatus of claim 22 wherein said peripheral flange is captured between the chamber lid and the chamber body using an electrically conductive material that provides for a flow of gas therethrough such that pressure equalization between said processing stations can take place through the electrically conductive material around the peripheral flange.

24. The apparatus of claim 7 wherein each first annular shield member includes a cylindrical body having a first end that opens towards an associated one of said plasma sources and a second end that opens at least generally towards an exhaust port of the chamber and said second end of the first annular shield member supports a plurality of web members that extend inward and across an opening of said second end to said workpiece pedestal and are spaced apart around said opening to provide electrical communication between the first annular shield member and the workpiece pedestal.

25. The apparatus of claim 24 wherein said workpiece pedestal includes a ground shield and each web member is grounded to the ground shield, serving to ground the first annular shield member.

26. The apparatus of claim 24 wherein each web member includes a free end and said shield arrangement includes a clamp ring that captures the free end of each web member against the associated one of the workpiece pedestals.

27. The apparatus of claim 24 wherein said chamber body defines an exhaust opening between said processing stations for vacuum pumping the chamber interior which produces a given flow pattern, without said shield arrangement, around a periphery of each of the workpiece pedestals responsive to said vacuum pumping and wherein said web members define an arrangement of apertures surrounding each workpiece pedestal which cooperates with the shield arrangement to produce a modified flow pattern around the periphery of each of the workpiece pedestals that is more uniform than the given flow pattern.

28. The apparatus of claim 27 wherein the arrangement of apertures defined by the web members includes a plurality of apertures around each of the work piece pedestal such that apertures having at least two different aperture areas are defined to produce the modified flow pattern.

29. The apparatus of claim 27 wherein the arrangement of apertures produces a variable conductance around the periphery of the workpiece pedestal resulting in the modified flow pattern.

30. The apparatus of claim 27 wherein the arrangement of apertures includes apertures that progressively increase in area with increasing distance from the exhaust opening.

31. The apparatus of claim 7 wherein said chamber body defines an exhaust opening between said processing stations for vacuum pumping the chamber interior and wherein said second end of the first annular shield member includes a grid member that extends inward and across an opening of said second end to said workpiece pedestal to provide electrical communication between said first annular shield member and the workpiece pedestal and said grid member defines a plurality of apertures for providing a gas flow communication from within said shield arrangement to said exhaust opening.

32. The apparatus of claim 31 wherein said grid member is annular and said plurality of apertures defined by the grid member produces a variable conductance around the periphery of the workpiece pedestal that results in the modified flow pattern.

33. The apparatus of claim 32 wherein each of said apertures is at least approximately equal in diameter and a density of the apertures around the periphery changes to produce the variable conductance.

34. The apparatus of claim 33 wherein the density of apertures progressively increases with distance from the exhaust opening.

35. The apparatus of claim 7 wherein said chamber body defines an exhaust opening between said processing stations for vacuum pumping the chamber interior which produces a given flow pattern, without said shield arrangement, around a periphery of each of the workpiece pedestals responsive to said vacuum pumping and wherein each first annular shield member includes a cylindrical body having a first end that opens towards an associated one of said plasma sources and a second end that opens at least generally towards the exhaust opening and said second end includes a baffle surrounding each workpiece pedestal which produces a modified flow pattern around the periphery of each of the workpiece pedestals that is more uniform than the given flow pattern.

36. The apparatus of claim 1 wherein said chamber defines a plasma opening for each of the plasma sources and wherein each shield arrangement includes
(i) a first annular shield member defining a circular opening that faces an associated one of the treatment sources and an opposing, second opening with an annular first shield member body extending between the first and second openings to define a first axis of symmetry, and
(ii) a second annular shield member having a second axis of symmetry and a length therealong that defines a first end aperture that faces the second opening of the first shield member and that defines an opposing, second end aperture that is spaced away from said first end aperture by a length of the second annular shield member along the second axis of symmetry and said second annular shield member is supported for movement along said second axis of symmetry between a first position and a second position such that the first end aperture of the second annular shield member moves in a confronting relationship toward and away from the second opening of the first annular shield member to cooperate with the first annular shield member for operation of the shield arrangement in said wafer transfer mode having the first end aperture of the second annular shield member in said first position at a given distance from the second opening of the first annular shield member, and at which second position, the first end aperture of the second annular shield member is at a different distance from the second opening of the first annular shield member that is less than the given distance to cooperate with the first annular shield member for operation of the shield arrangement in the treatment mode.

37. The apparatus of claim 36 wherein the first annular shield member includes a first annular shield member body characterized by a first thickness at said second opening and said second annular shield member includes a second annular shield member body characterized by a second thickness at said first end aperture, and one of the first thickness and the second thickness defines an annular groove while the other one of the first and second thickness defines a tongue such that, when the second annular shield member is in said second position, the tongue extends into said groove in a non-contacting manner to define a circuitous path from any position interior to each shield arrangement to any position exterior to that shield arrangement.

38. The apparatus of claim 36 wherein the first annular shield member includes a first annular shield member body characterized by a first thickness at said second opening and said second annular shield member includes a second annular shield member body characterized by a second thickness at said first end aperture such that, when the second annular shield member is in said second position, the first thickness and the second thickness cooperate in a confronting relationship to define a circuitous non-line-of-sight path from any position interior to each shield arrangement to any position exterior to that shield arrangement.

39. The apparatus of claim 1 wherein said chamber defines a plasma opening for each of the plasma sources and wherein each shield arrangement includes
a first shield member having a sidewall that defines a peripheral outline that is elongated in configuration to define an axis of elongation and said peripheral outline encloses a given one of said workpieces when supported by a respective one of the processing stations, and said first shield member further defining a first opening that faces an associated one of the treatment sources and an opposing, second opening, and said sidewall defines a sidewall door that adjoins said second opening and which extends toward said first opening to provide for transferring the given workpiece to and from the workpiece pedestal of the respective processing station through the sidewall door, said sidewall door including a door edge profile in the sidewall; and
a second shield member that is supported for movement at least generally parallel to said axis of elongation having a second shield member peripheral outline that is complementary to said door edge profile such that the second shield member moves in a confronting relationship toward and away from the sidewall door of the first shield member to cooperate with the first shield member for operation of the shield arrangement in said wafer transfer mode having the second shield member in said first position at a given distance from the door edge profile, and at which second position, the second shield member is at a different distance from the door edge profile that is less than the given distance to cooperate with the first shield member for operation of the shield arrangement in the treatment mode.

40. The apparatus of claim 39 wherein the second shield member and the door edge profile cooperate in a confronting relationship, with the second shield member in said second position, to define a circuitous, non-line-of-sight path from any position interior to each shield arrangement to any position exterior to that shield arrangement.

41. The apparatus of claim 1 wherein the electrically conductive shield arrangement is grounded.

42. The apparatus of claim 1 wherein said shield arrangement includes a first annular shield member surrounding the workpiece in a stationary position and a second shield member that is supported for movement between a first position and a second position in which first position the second shield member cooperates with the first shield member for operation of the shield arrangement in said wafer transfer mode, and in which second position, the second shield member cooperates with the first shield member for operation of the shield arrangement in the treatment mode, each first annular shield member including a first end that opens towards an associated one of said plasma sources and a second end that opens at least generally towards an exhaust port of the chamber and a baffle supported at the second end of each first annular shield member to extend partially around each workpiece pedestal having a baffle width that changes around the periphery of the workpiece pedestal to produce a variable conductance around the periphery of the workpiece pedestal that results in the modified flow pattern.

43. The apparatus of claim 42 wherein each baffle is formed to define a line of symmetry.

44. The apparatus of claim 43 wherein the line of symmetry is arranged to bisect the exhaust channel.

45. The apparatus of claim 1 wherein said electrically conductive shield arrangement provides an arrangement of conductive, grounded surfaces surrounding each processing station in the treatment mode that is more symmetric than the asymmetrically distributed electrically conductive chamber surfaces.

* * * * *